United States Patent [19]
Saito et al.

[11] Patent Number: 5,566,113
[45] Date of Patent: Oct. 15, 1996

[54] SEMICONDUCTOR MEMORY CIRCUIT HAVING VERIFY MODE

[75] Inventors: Hidetoshi Saito, Yokohama; Tadashi Miyakawa, Tokyo, both of Japan

[73] Assignee: Kabushiki Kaisha Toshiba, Tokyo, Japan

[21] Appl. No.: 412,864

[22] Filed: Mar. 29, 1995

[30] Foreign Application Priority Data

Mar. 30, 1994 [JP] Japan ................................ 6-060521

[51] Int. Cl.$^6$ .................................................. G11C 7/00
[52] U.S. Cl. ...................... 365/201; 365/218; 365/189.05
[58] Field of Search .................................... 365/201, 218, 365/189.05, 189.07, 185.22; 371/21.2, 21.4

[56] References Cited

U.S. PATENT DOCUMENTS

| | | | |
|---|---|---|---|
| 5,335,198 | 8/1994 | van Burskik et al. | 365/218 |
| 5,386,422 | 1/1995 | Endoh | 365/201 |
| 5,414,664 | 5/1995 | Lin | 365/218 |

OTHER PUBLICATIONS

Takeshi Nakayama, et al., "A 60ns 16Mb Flash EEPROM with Program and Erase Sequence Controller", ISSCC91/ Session 16/Non–Volatile And Specialty Memory/Paper FA 16.1, 1991 IEEE International Solid–State Circuits Conference, pp. 260–261.

*Primary Examiner*—Amir Zarabian
*Attorney, Agent, or Firm*—Loeb & Loeb LLP

[57] ABSTRACT

A comparator compares data read out by a sensing amplifier with input data, and outputs equality data when both of the data are equal to each other, while the comparator outputs inequality data when both of the data are not equal to each other. When the comparator outputs inequality data for at least one time within a predetermined period decided by a control signal, the latch circuit latches and keeps outputting the inequality data. The latch circuit latches and outputs equality data when the comparator continuously outputs equality data within the period. Within the period decided by the control signal, the determination circuit determines whether or not writing has been completed on the basis of output data of the latch circuit. The re-write signal generator circuit sends a re-write signal to a write circuit when the determination circuit determines that writing is not yet completed.

14 Claims, 14 Drawing Sheets

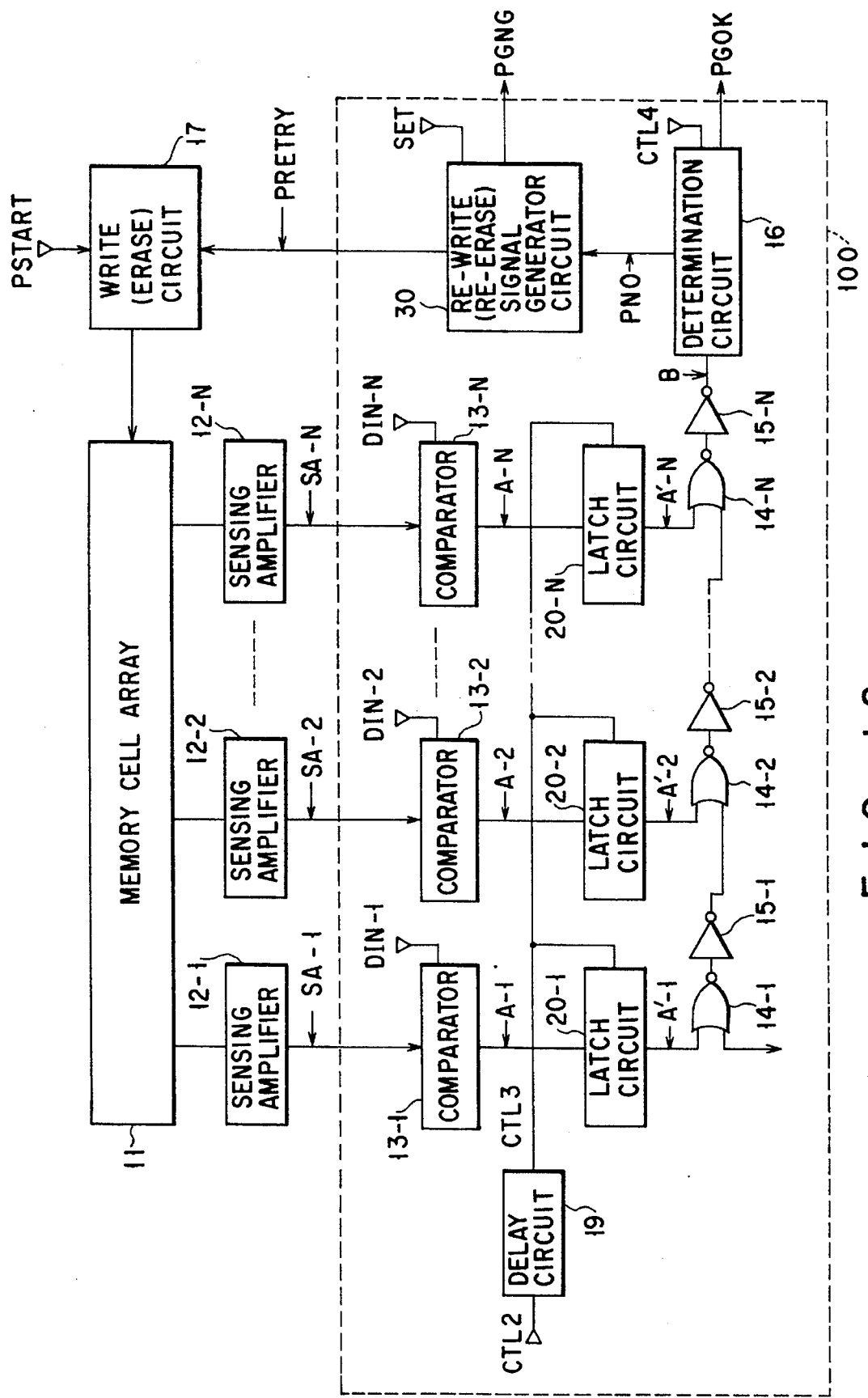
F I G. 12

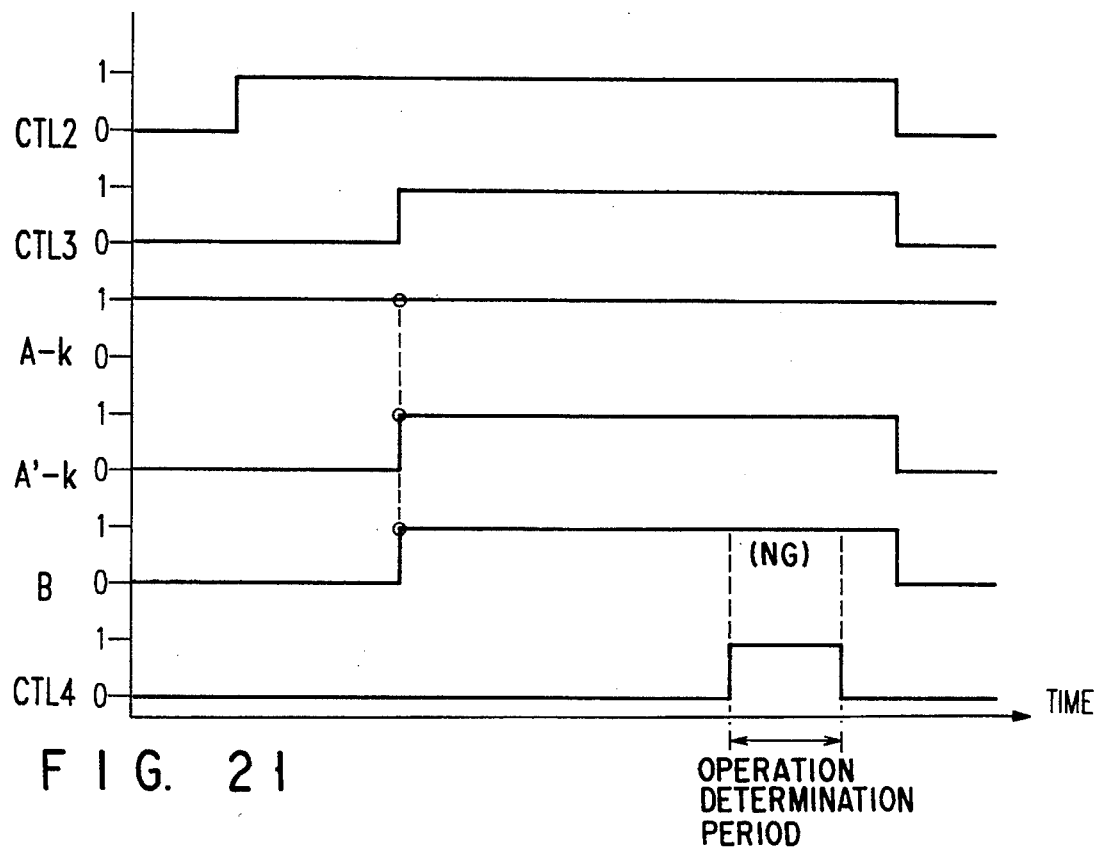
FIG. 21 OPERATION DETERMINATION PERIOD
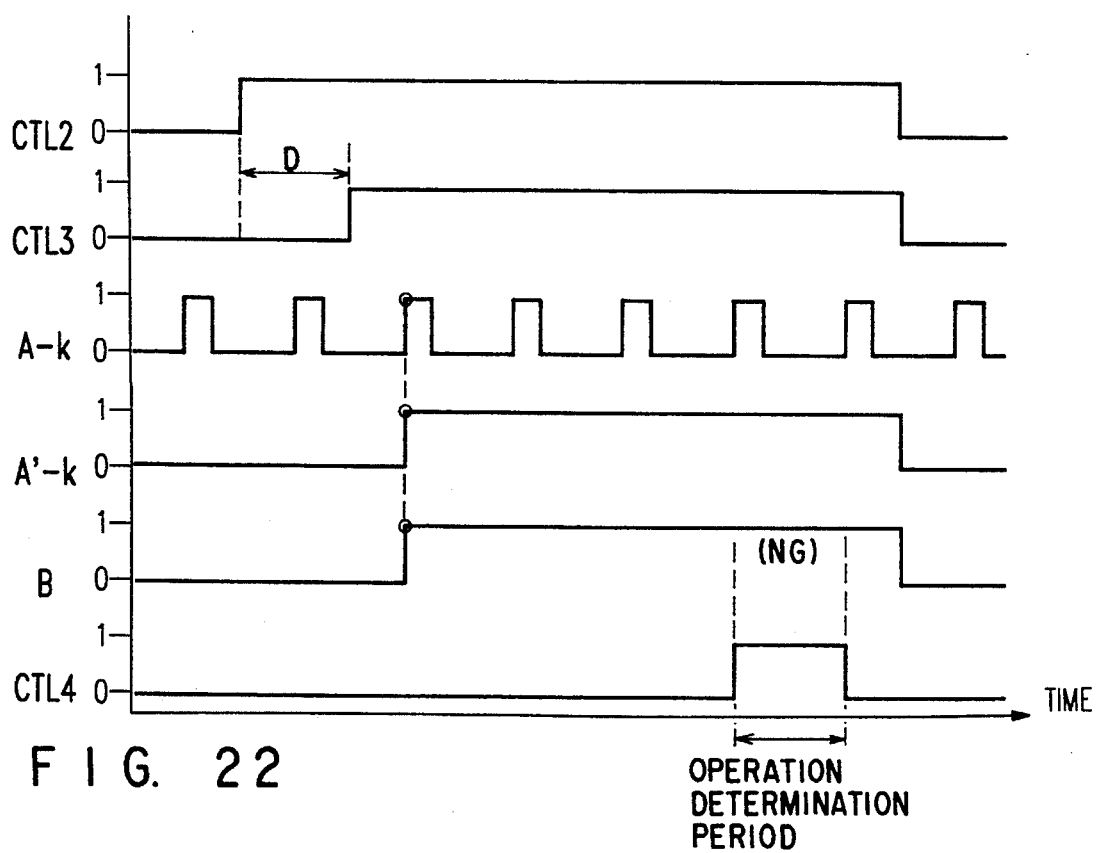
FIG. 22 OPERATION DETERMINATION PERIOD

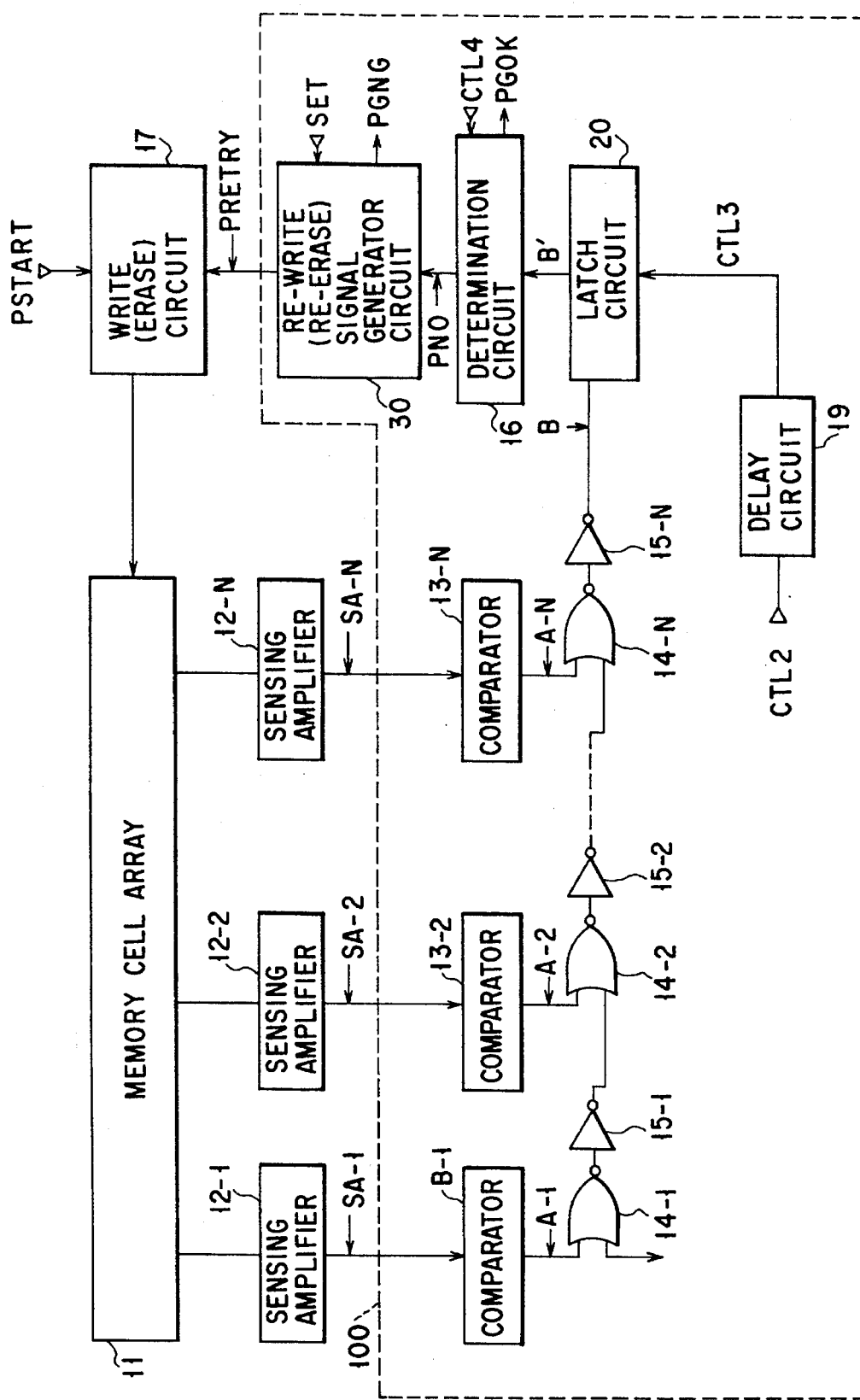
F I G. 25

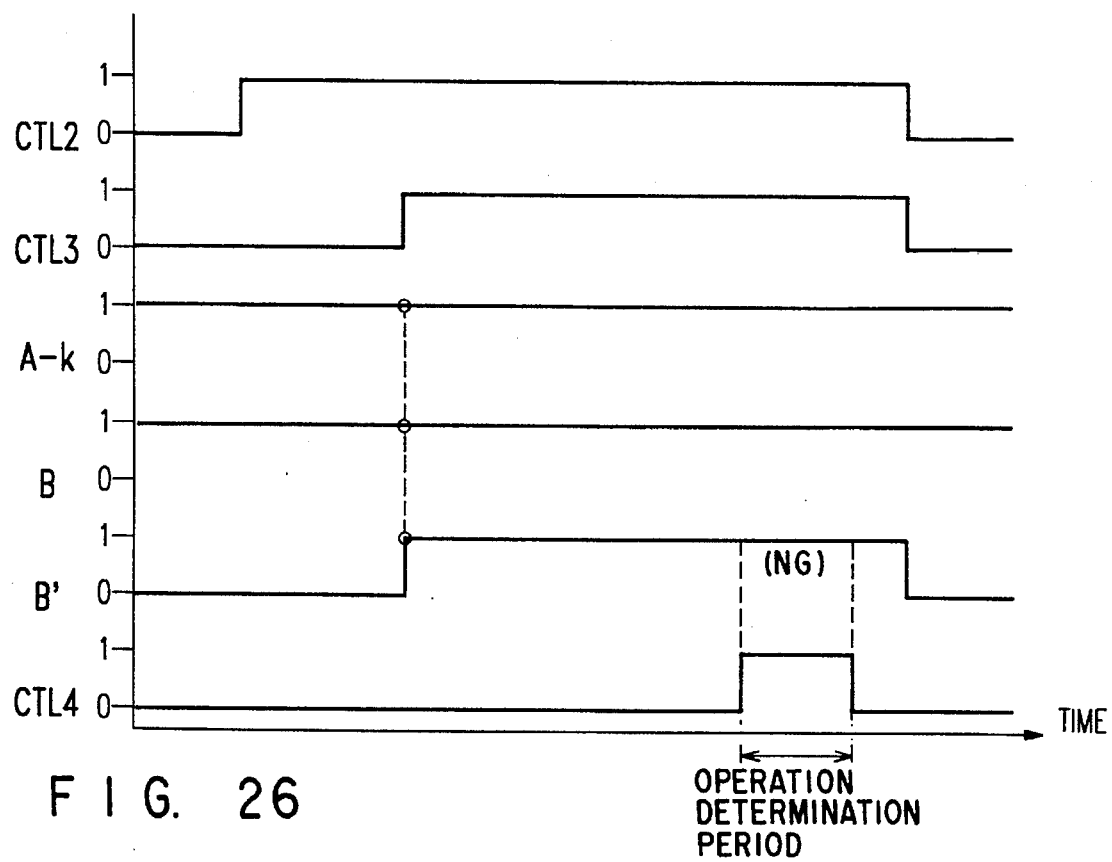
F I G. 26
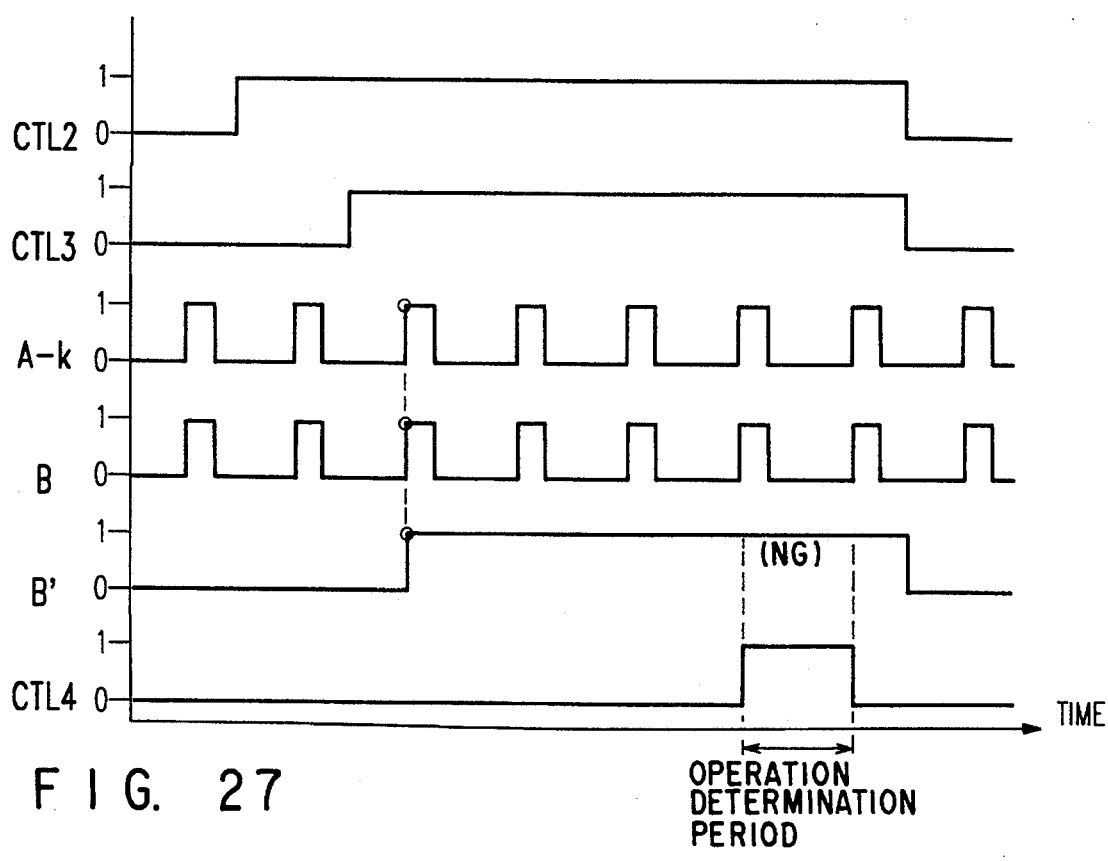
F I G. 27

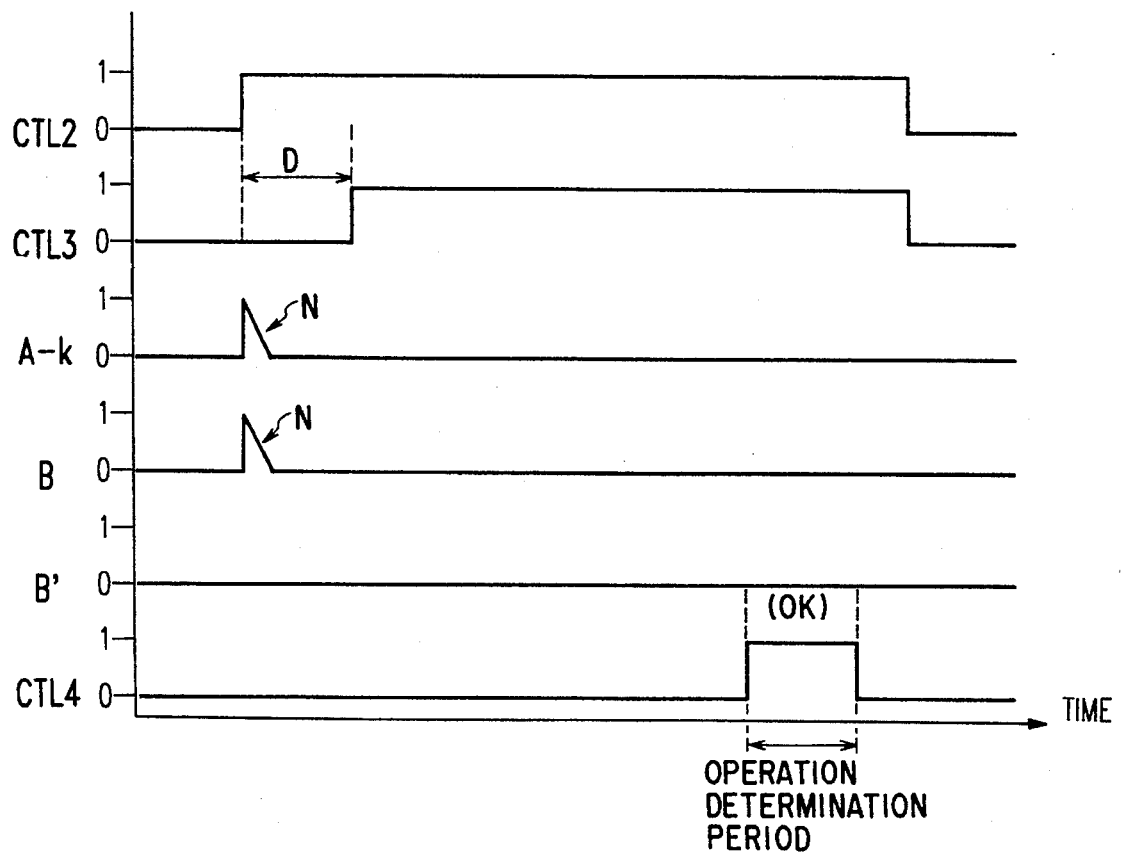
F I G. 28

SEMICONDUCTOR MEMORY CIRCUIT HAVING VERIFY MODE

BACKGROUND OF THE INVENTION

1. Field of the Invention

The present invention particularly relates to improvements in automatic writing and erasure functions of a semiconductor memory circuit capable of electrically writing and erasing data.

2. Description of the Related Art

Conventionally, a semiconductor memory, e.g., a flash EEPROM has three basic modes, i.e., a writing mode, an erasure mode, and a reading mode.

FIG. 1 is a flow chart showing a so-called automatic writing mode as a variation of the writing mode.

This automatic writing mode will be briefly explained as follows.

At first, address data and input data are inputted into a memory circuit (in a step ST1), and the input data is written into memory cells designated by the address data (in a step ST2).

After a recovery time in which a high voltage to be applied to the memory cell is discharged (in a step ST3), the memory is brought into a verify mode in which a threshold value of the memory cell is verified by a sensing amplifier (in a step ST4).

Output data of sensing amplifiers and the input data of the memory circuit are compared with each other by a comparator. If both of the data are equal to each other, writing of the input data is regarded as completed. If both of the data are not equal to each other, re-writing of the input data is carried out (in steps ST5 to ST7).

Re-writing of input data can be performed for up to twenty-five times, and if both of output and input data are not then equal to each other, the memory circuit itself is determined as defective.

Thus, in an automatic writing mode, after desired data is written into memory cells, threshold values of the memory cells are read out by sensing amplifiers, and determination is automatically made as to whether the desired data has been properly written. If desired data has not been properly written into the memory cell, writing of the data is repeated until the desired data is properly written.

An automatic erasure mode is also used in addition to the automatic writing mode. In an automatic erasure mode, after data in memory cells is erased, threshold values of the memory cells are read by sensing amplifiers, and determination is automatically made as to whether or not the data in the memory cells has been properly erased. If the data in the memory cells have not been properly erased, erasure of the data is repeated until the data in the memory cells are properly erased.

(1) Conventional circuit A

FIGS. 2 to 4 show an example of a conventional circuit. FIG. 3 is a circuit diagram showing the structure of a sensing amplifier shown in FIG. 2, and FIG. 4 is a circuit diagram showing the structure of a comparator shown in FIG. 2.

A write (or erase) circuit 17 receives a write (or erase) start signal PSTART, and performs writing or erasure of data with respect to predetermined main cells (memory cells) MC of a memory cell array 11. When verifying data, determination is made as to whether or not predetermined data has been properly written into the main cells MC.

Firstly, data in those memory cells MC into which data have already been written is read out by sensing amplifiers 12-1 to 12-N.

The sensing amplifiers 12-1 to 12-N adopt a method of comparing a cell current of a main cell MC with a cell current of a reference cell RC. A cell current depends on a word line potential (or gate potential) VWL and a threshold value Vth of each main cell.

If a word line potential is kept constant, a main cell MC is turned off when the threshold value Vth is sufficiently high, and a cell current therefore does not flow through the main cell MC. Therefore, the drain potential of a transistor P1 becomes higher than the drain potential VREF of a transistor P2. That is, a sensing amplifier output data "0".

On the other hand, a main cell MC is turned on when the threshold value of the main cell MC is sufficiently low, and a cell current flow through the main cell MC. Therefore, the drain potential VSA of the transistor P1 becomes lower than the drain current VREF of the transistor P2. That is, a sensing amplifier output data "1".

In this memory circuit, the word line potential VWL is set to 7 V during verification in an automatic writing mode (only where data "0" is written), while the word line potential VWL is set to 3 V during verification in an automatic erasure mode (in which all the data are set to "0"). Thus, the word line potential VWL during verification in these modes has a difference of ±2 V from the word line potential VWL (=5 V) when data is normally read out.

This difference is set such that the sensing amplifiers easily output data "1" during verification in the automatic writing mode (only where data "0" is written) and easily output data "0" during verification in the automatic erasure mode, in order to determine completion of writing or erasure put under stricter conditions, and to thereby achieve perfect writing and erasure of data.

Secondly, the input data (i.e., write data or erase data) DIN and output data of the sensing amplifiers SA are compared with each other by comparators 13-1 to 13-N.

Output data of the comparator 13-1 is inputted into an input terminal of an NOR circuit 14-1. Data "0" is inputted into another input terminal of the NOR circuit 14-1. Output data of the NOR circuit 14-1 is inputted into an inverter 15-1.

Output data of the comparator 13-2 is inputted into an input terminal of an NOR circuit 14-2. Output data of an inverter 15-1 is inputted into another input terminal of the NOR circuit 14-2. Output data of the NOR circuit 14-2 is inputted into an inverter 15-2.

In the same way, output data of a comparator 13-N (where N is a natural number) is inputted into an input terminal of an NOR circuit 14-N. Output data of an inverter 15-(N-1) is inputted into another input terminal of the NOR circuit 14-N. Output data of the NOR circuit 14-N is inputted into an inverter 15-n.

Then, output data B of the inverter 15-N is inputted into a determination circuit 16, and the determination circuit 16 determine whether or not desired data has been written into N pieces of main cells.

Specifically, if at least one of N comparators outputs data indicating incomplete writing or incomplete erasure (e.g., data "1"), output data B of the inverter 15-N is "1". Therefore, a determination circuit 16 determines that writing or erasure with respect to main cells is not completed, and sends a write incomplete (or erase incomplete) signal PNO to a re-write (or re-erase) signal generator circuit 30.

The re-write (or re-erase) signal generator circuit 30 receives the write incomplete (or erase incomplete) signal PNO, and sends a re-write (or re-erase) signal PRETRY to a write (or erase) circuit 17.

Then, the write (or erase) circuit 17 receives the re-write (or re-erase) signal PRETRY, and performs re-writing or re-erasure of data with respect to predetermined main cells MC of the memory cell 11.

Thereafter, verification is performed in the same way as explained above, and if verification is repeated for a predetermined number of times (e.g., twenty-five times), the re-write (or re-erase) signal generator circuit 30 generates a signal indicating a defective product without sending a re-write (or re-erase) signal PRETRY to the write (or re-erase) circuit 17.

Meanwhile, if all of the comparators output data indicating completion of writing or erasure (i.e., data "0"), the output data of the inverter 15-N is "0". Therefore, the determination circuit 16 determines that writing or erasure has been completed with respected to main cells, and outputs a signal indicating a valid product, without sending a write-incomplete (or erase-incomplete) signal PNO to the re-write (or re-erase) signal generator circuit 30.

(2) Conventional circuit B

FIGS. 5 and 6 show another example of a conventional circuit for executing an automatic writing (or erasing) mode. In addition, FIG. 6 is a circuit diagram showing the structure of a clocked inverter shown in FIG. 5.

This circuit has the same structure as the conventional circuit shown in FIG. 2, except for that a 10 clocked inverter 18 is connected between an inverter 15-N and a determination circuit 16.

The clocked inverter 18 is controlled in accordance with a control signal CTL1. While the control signal CTL1 is "1", the clocked inverter 18 maintains the conditions of data B which is obtained when the control signal CTL1 becomes "1", and outputs the data as output data B', as is shown in FIG. 7.

In case of a conventional circuit A, if the output data B is inverted to "1" from "0" in an operation determination range due to some reasons, the determination circuit 16 firstly determines that writing or erasure has been completed with respect to main cells, and then determines that writing or erasure is incomplete before the end of the range. The determination circuit 16 thus sends both of a re-write (or re-erase) signal PNO and a signal (PGOK) indicating completion of writing or erasure to the re-write (or re-erase) signal generator circuit 30, which cause an erroneous operation.

In case of a conventional circuit B, such an erroneous operation as shown in a conventional circuit A is prevented since an input B' is fixed to "0" or "1" when the control signal CTL1 is "1" (i.e., during an operational determination range).

However, operation in the automatic writing (or erasure) mode is arranged such that the threshold value Vth of main cells is raised or lowered every time when writing or erasure is repeated.

Therefore, during verification in an automatic writing mode (only where data "0" is written), a sensing amplifiers is subjected to a change that a relation of VSA<Vref changes to a relation of VSA>Vref, i.e., the output of the sensing amplifier changes to "0" from "1".

Further, during verification in an automatic erasure mode, a relation of VSA>Vref changes to VSA<Vref in a sensing amplifier, i.e., the sensing amplifiers are subjected to a change that the output thereof changes from "0" to "1".

Thus, in the way in which the output of a sensing amplifier changes from "1" to "0" or from "0" to "1", there must be a phase in which VSA is equal to Vref. In this phase, the output of the sensing amplifier is so unstable that the sensing amplifier is brought into an oscillating condition, i.e., alternately outputs data "0" and data "1".

When the output of the sensing amplifier thus oscillates, the output of a comparator naturally oscillates. In this case, since determination as to whether writing (or erasure) has been completed or is incomplete is made at the instance when the control signal CTL1 in the clocked converter changes from "0" to "1", determination indicating complete writing (or erasure) may be made at a certain probability, or determination indicating incomplete writing (or erasure) may be made at a certain provability, as shown in FIGS. 10 and 11, even though the threshold value of main cells is substantially equal to that of a reference cell.

Therefore, for example, in an automatic writing mode, determination that data writing has been completed is made even when the relation of VSA>Vref is not satisfied, and leads to a problem that writing of data is insufficient. On the other hand, there simultaneously exist several main cells which satisfy the relation of VSA>Vref. This results in a problem that a distribution of threshold values Vth of main cells is broadened after completion of data writing.

SUMMARY OF THE INVENTION

The present invention has been made to solve the above problems, and has an object of providing a semiconductor memory circuit capable of setting a stable threshold value for main cells by eliminating a dispersion in determination results caused by an oscillation of a sensing amplifier during verification in a data writing or erasure mode, and by completely performing data writing or erasure.

To achieve the above abject, the semiconductor memory circuit having a verify mode, according to the present invention, comprises: first means for writing input data into a main cell; a sensing amplifier for reading data in the main cell; a comparator for comparing data read through the sensing amplifier with the input data, thereby determining whether or not both of the data are equal to each other, and for outputting equality data when both of the data are equal to each other, and outputting inequality data when both of the data are not equal to each other; a latch circuit for receiving an input of a first control signal, for latching and keeping outputting the inequality data when the comparator outputs for at least one time in a predetermined period decided by the first control signal, and for latching and keeping outputting the equality data only when the comparator continuously outputs the equality data in the predetermined period; a determination circuit for receiving an input of a second control signal, and for determining whether writing of the input data has been completed with respect to the main cell on the basis of output data of the latch circuit in a predetermined period decided by the second control signal; and second means for instructing the first means to write the input data again to the main cell when the determination circuit determines that writing of the input data is incomplete with respect to the main cell.

In addition, the semiconductor memory circuit having a verify mode, according to the present invention, comprises: first means for erasing input data stored in a main cell; a sensing amplifier for reading data in the main cell; a comparator for comparing data read through the sensing amplifier with data remaining when data is completely erased in the main cell, thereby determining whether or not both of the data are equal to each other, and for outputting equality data when both of the data are equal to each other, and outputting inequality data when both of the data are not equal to each other; a latch circuit for receiving an input of a first control signal, for latching and keeping outputting the inequality data when the comparator outputs for at least one time in a predetermined period decided by the first control signal, and for latching and keeping outputting the equality data only when the comparator continuously outputs the equality data in the predetermined period; a determination circuit for receiving an input of a second control signal, and for determining whether erasure of the data in the main cell has been completed with respect to the main cell on the basis of output data of the latch circuit in a predetermined period decided by the second control signal; and second means for instructing the first means to erase the data in the main cell again when the determination circuit determines that erasure of the data in the main cell is incomplete.

The sensing amplifier adopts a method of comparing a threshold value of a main cell with a threshold value of a reference cell, and deciding data to be read out, depending on the amounts of cell currents, one flowing through the main cell and the other flowing through the reference cell.

The memory circuit of the present invention starts reading data of the main cell in response to a third control signal, and further comprises a delay circuit for delaying the third control signal by a predetermined time period, to obtain the first control signal.

The memory circuit of the present invention further comprises N (where N is a natural number) sets of third means, each set consisting of the sensing amplifier, the comparator and the latch circuit, and fourth means for outputting inequality data when at least one of the N sets of third means outputs inequality data, and outputting equality data only when all the third means output equality data. In this case, output data of the fourth means is inputted into the determination circuit.

The memory circuit of the present invention further comprises N (where N is a natural number) sets of third means, each set consisting of the sensing amplifier and the for and fourth means for outputting inequality data when at least one of the N sets of third means outputs inequality data, and outputting equality data only when all the third means output equality data. In this case, output data of the fourth means is inputted into the determination circuit.

The determination circuit outputs a write complete signal when it determines that writing has been completed, and outputs an erase complete signal when it determines that erasure has been completed.

The second means outputs a signal indicating that a product is defective, when data writing is repeated for a predetermined number of times, and thereafter prevents the first means from writing data again. In addition, the second means outputs a signal indicating that a product is defective, when data erasure is repeated for a predetermined number of times, and thereafter prevents the first means from erasing data again.

According to the above structure, output data of the comparator is inputted into the determination circuit through the latch circuit when the comparator outputs inequality for at least one time in a predetermined period decided by a first control signal, the latch circuit latches and keeps outputting the inequality data. The latch circuit latches equality data only when the comparator continuously outputs equality data.

Thus, if writing or erasure of data is not completed with respect to a main cell, output data of the sensing amplifier oscillates, and the comparator alternately outputs equality data and inequality data, the latch circuit keeps outputting inequality data.

Therefore, when the latch circuit outputs equality data (indicating completion of writing or erasure), a sufficient difference exists between the threshold value of a main cell and the threshold value of a reference cell, so that writing or erasure can be sufficiently performed and the distribution of threshold values of main cells after writing or erasure can be set in a narrow range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a diagram showing a semiconductor memory circuit according to a first embodiment of the present invention.

FIG. 21 is a timing chart showing operation of the circuit shown in FIG. 12

FIG. 22 is a timing chart showing operation of the circuit shown in FIG. 12.

FIG. 25 is a diagram showing a semiconductor memory circuit according to a second embodiment of the present invention.

FIG. 26 is a timing chart showing operation of the circuit shown in FIG. 25.

FIG. 27 is a timing chart showing operation of the circuit shown in FIG. 25.

FIG. 28 is a timing chart showing operation of the circuit shown in FIG. 25.

DETAILED DESCRIPTION OF THE PREFERRED EMBODIMENTS

In the following, a semiconductor memory circuit according to the present invention will be explained in detail with reference to the drawings.

FIG. 12 shows a semiconductor memory according to a first embodiment of the present invention. In FIG. 12, the portion surrounded by a broken line 100 corresponds to a write (or erase) circuit.

The structure of this semiconductor memory circuit will be explained below.

Figure 1:
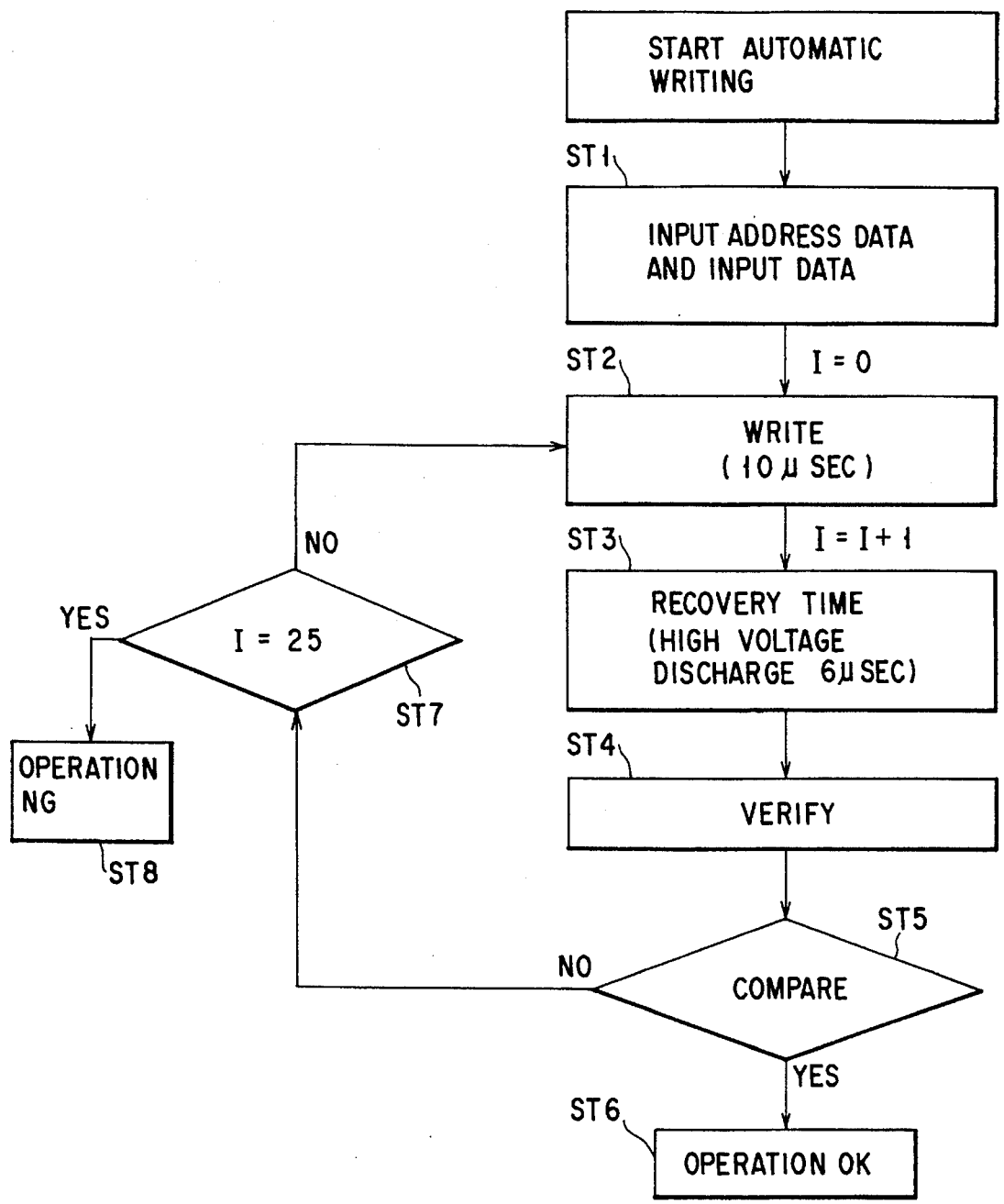
FIG. 1 is a flow chart showing a conventional automatic writing mode.
Figure 2:
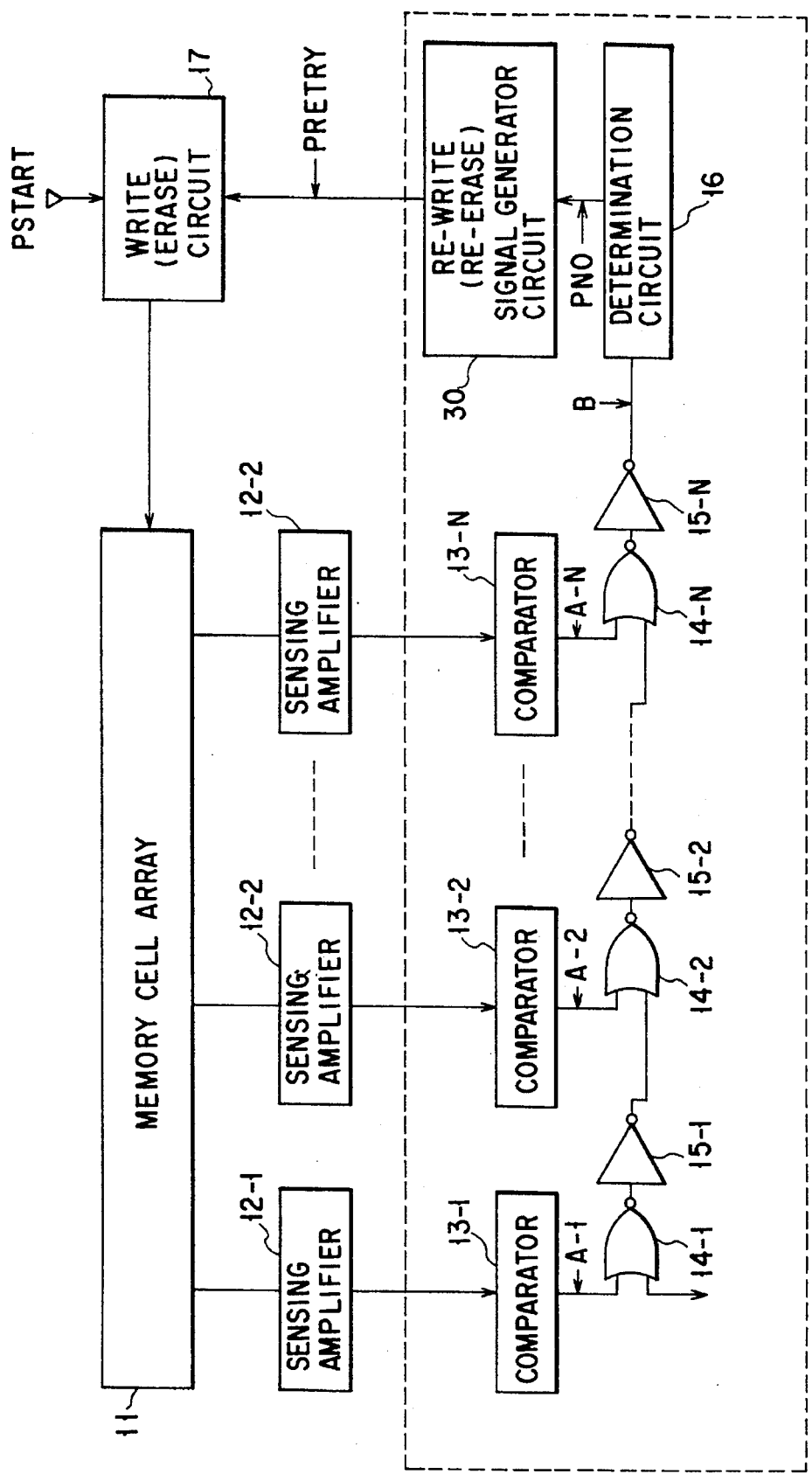
FIG. 2 is a diagram showing a conventional semiconductor memory circuit.
Figure 3:
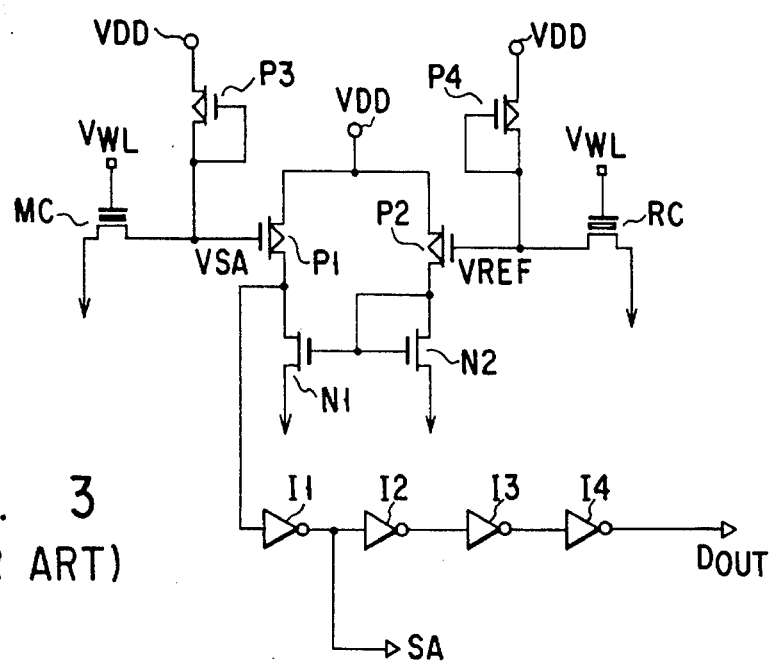
FIG. 3 is a circuit diagram showing a sensing amplifier of the circuit shown in FIG. 2.

Main cells 11 are connected with sensing amplifiers 12-1 to 12-N. Each sensing amplifier changes its output, depending on the relationship between the threshold value of a main cell and the threshold value of a reference cell. Specifically, when the threshold value of a main cell is greater than the threshold value of a reference cell (i.e., when data "0" is stored), data "0" is outputted. When the threshold value of a main cell is smaller than the threshold value of a reference cell (i.e., when data "1" is stored), data "1" is outputted. For example, the circuit shown in FIG. 3 may be used for each of the sensing amplifiers.

Figure 4:
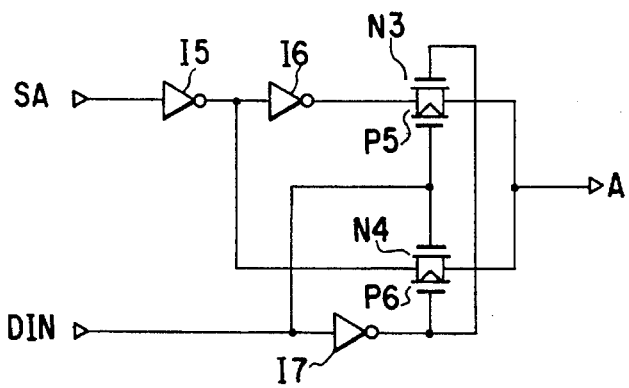
FIG. 4 is a circuit diagram showing a comparator of the circuit shown in FIG. 2.
Figure 6:
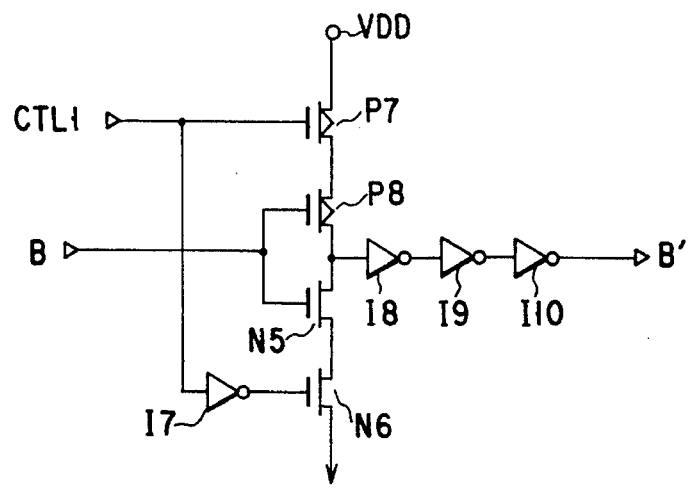
FIG. 6 is a circuit diagram showing a clocked inverter of the circuit shown in FIG. 5.
Figure 5:
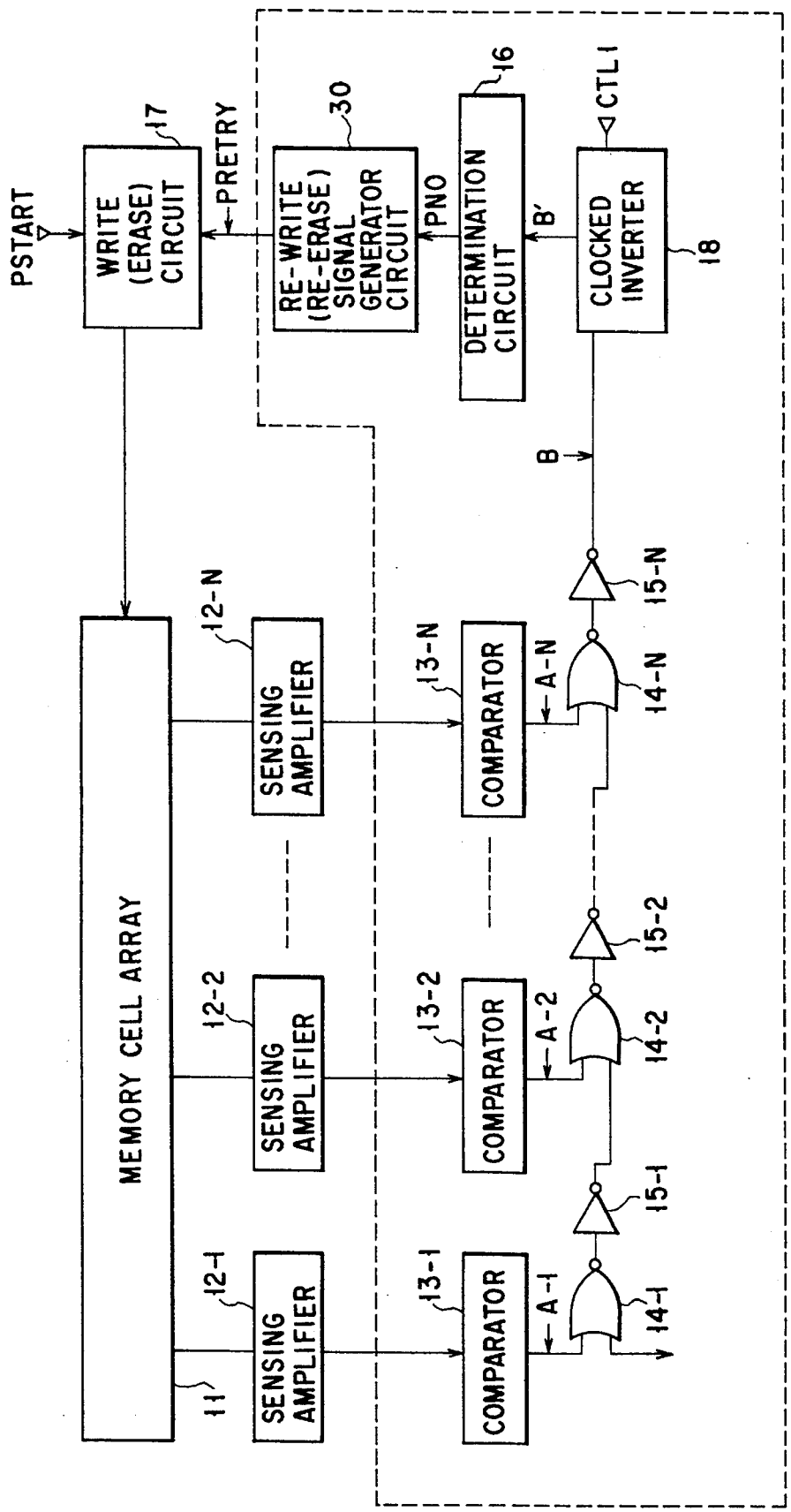
FIG. 5 is a diagram showing a conventional semiconductor memory circuit.
Figure 7:
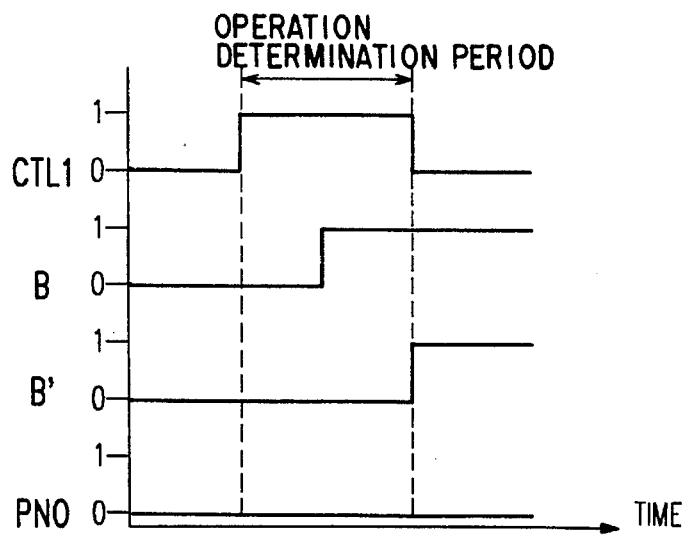
FIG. 7 is a timing chart showing operation of the circuit shown in FIG. 5.
Figure 8:
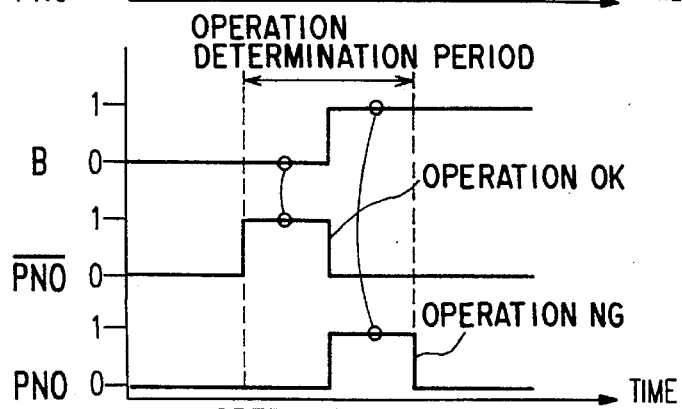
FIG. 8 is a timing chart showing operation of the circuit shown in FIG. 2.
Figure 10:
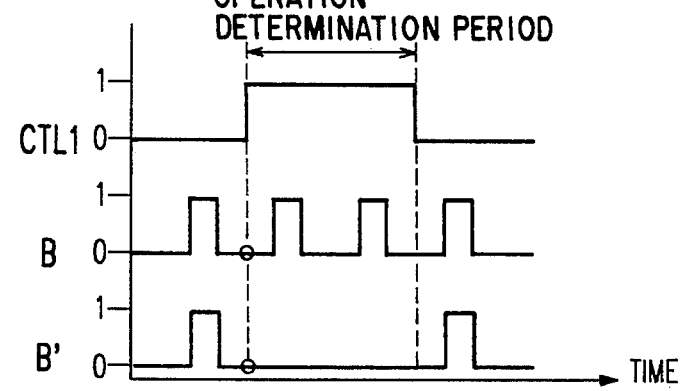
FIG. 10 is a timing chart showing operation of the clocked inverter of FIG. 5.
Figure 11:
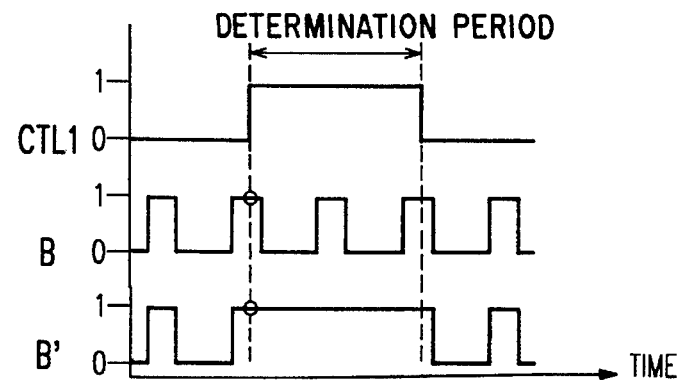
FIG. 11 is a timing chart showing operation of the clocked inverter of FIG. 5.
Figure 9:
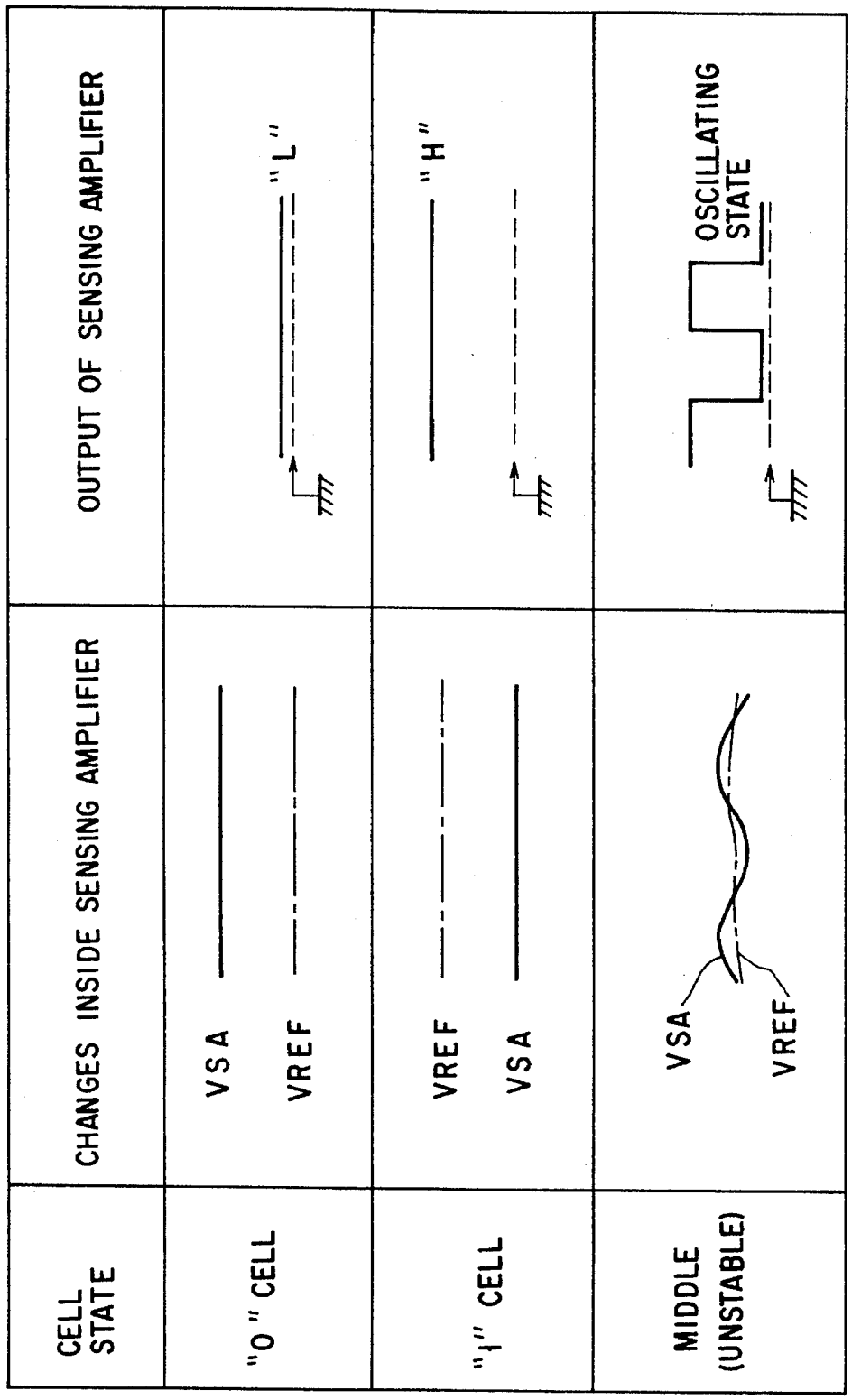
FIG. 9 shows a relationship between a threshold value of a main cell and an output of a sensing amplifier.

The sensing amplifiers 12-1 to 12-N are connected with comparators 13-1 to 13-N. The comparators 13-1 to 3-N compare input data (i.e., write data or erase data) with output data from the sensing amplifiers. Then, each comparator generates an output (data "0") indicating completion of writing or erasure when both of the input data and output data are equal to each other. When both of the data are not equal to each other, the comparator generates an output (data "1") indicating incomplete writing or erasure. For example, the circuit shown in FIG. 4 may be used for each comparator.

Figure 13:
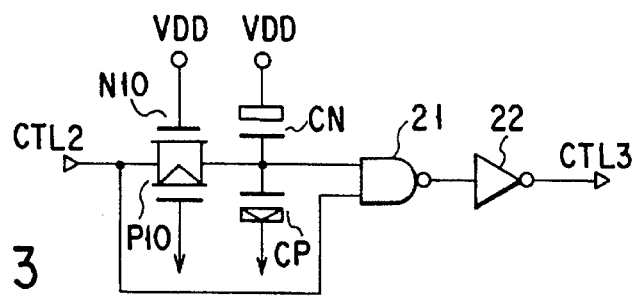
FIG. 13 is a circuit diagram showing a delay circuit of the circuit shown in FIG. 12.

The comparators 13-1 to 13-N are connected with latch circuits 20-1 to 20-N. Each latch circuit is inputted with a control signal CTL3. A control signal CTL3 is obtained by making a control signal CTL2 from an external device pass through a delay circuit 19. When the control signal CTL2 is inputted into a memory circuit, a verify mode is executed. The delay circuit has a structure as shown in FIG. 13, for example.

Specifically, a control signal CTL2 is inputted into an input end of a NAND circuit 21. Sources and drains of a P-channel MOS transistor P10 and an N-channel MOS transistor N10 are connected between the end of the NAND circuit 21 to which the control signal CTL2 is inputted and the other input end thereof. The gate of the P-channel MOS transistor P10 is applied with a ground potential while the gate of the N-channel MOS transistor N10 is applied with a source potential VDD. The other input end of the NAND circuit 21 is connected with MOS capacitors CP and CN. An output end of the NAND circuit 21 is connected to an input end of an inverter 22. The inverter 22 outputs a control signal CTL3.

The delay circuit delays a change of the control signal CRL3 from "0" to "1" by a predetermined period, only when the control signal CTL2 changes from "0" to "1" (at a starting point of an operation determination period).

Figure 14:
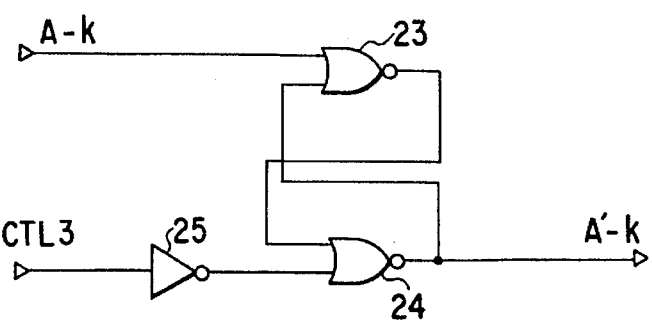
FIG. 14 is a circuit diagram showing a latch circuit of the circuit shown in FIG. 12.

A latch circuit has a structure as shown in FIG. 14, for example.

Specifically, an input end of a NOR circuit 23 is inputted with output data A-k (k is 1, 2, . . . N). An output end of the NOR circuit 23 is connected to an input end of a NOR circuit 24. A control signal CTL3 is inputted into another input end of the NOR circuit 24 through an inverter 25. An output end of the NOR circuit 24 is connected to another input end of the NOR circuit 23. Output data A'-k of the latch circuit is obtained from the output end of the NOR circuit 24.

Figure 15:
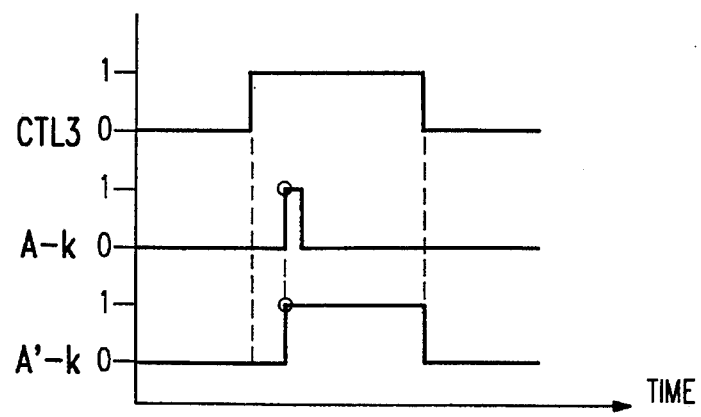
FIG. 15 is a timing chart showing operation of the latch circuit shown in FIG. 14.

For example, as shown in FIG. 15, if output data A-k of a comparator becomes "1" (indicating incomplete writing or erasure) during a period (i.e., an operation determination period) in which the control signal CTL3 is "1", the latch circuit keeps outputting data "1" as output data A'-k from the time point when the output data A-k becomes "1".

Figure 16:
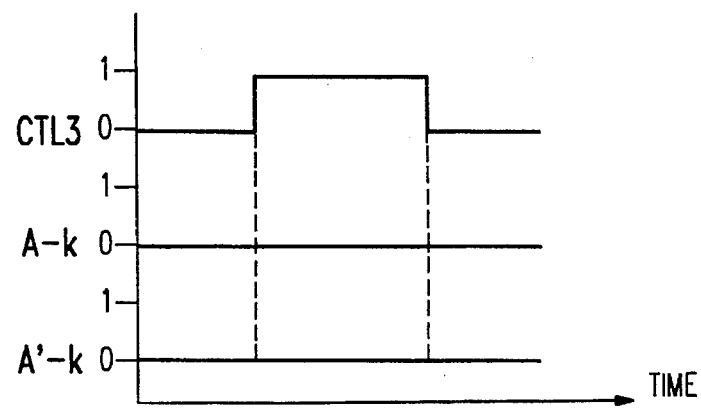
FIG. 16 is a timing chart showing operation of the latch circuit shown in FIG. 14.

In addition, for example, as shown in FIG. 16, the latch circuit keeps outputting data "0" only when the output data A-k of a comparator is continuously "0" (indicating completion of writing or erasure).

The output data of a latch circuit 20-1 is inputted into an input end of a NOR circuit 14-1. Data "0" is inputted into another input end of the NOR circuit 14-1. Output data of the NOR circuit 14-1 is inputted into an inverter 15-1.

The output data of a latch circuit 20-2 is inputted into an end of an NOR circuit 14-2. Output data of the inverter 15-1 is inputted into another input end of the NOR circuit 14-2. Output data of the NOR circuit 14-2 is inputted into an inverter 15-2.

In the same way, output of a latch circuit 20-N is inputted into an end of a NOR circuit 14-N. Output data of an inverter 15-(N-1) is inputted into another end of the NOR circuit 14-N. Output data of the NOR circuit 14-N is inputted into an inverter 15-N.

Then, output data B of the inverter 15-N is inputted into a determination circuit 16, and the determination circuit determines whether or not desired data has been written into N pieces of main cells. If the determination circuit 16 determines that desired data has not been written in any one or more of the N pieces of main cells, this circuit 16 sends a write (or erase) incomplete signal PNO to a re-write (or re-erase) signal generator circuit 30.

Figure 17:
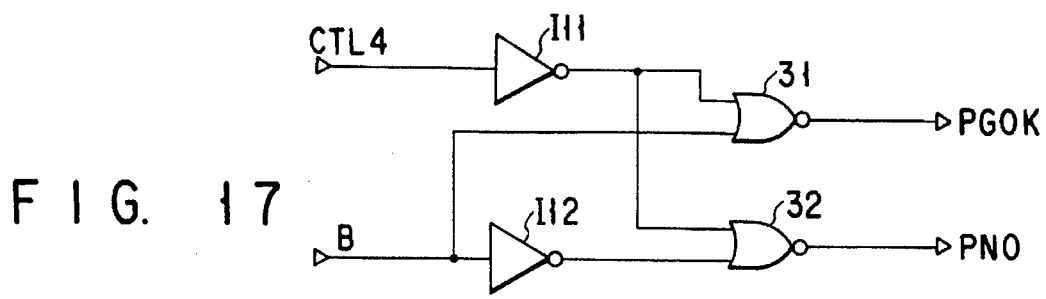
FIG. 17 is a circuit diagram showing a determination circuit of the circuit shown in FIG. 12.

The determination circuit 16 has a structure as shown in FIG. 17, for example.

Specifically, a control signal CTL4 is inputted into an end of an NOR circuit 31 and an end of a NOR circuit 32, through an inverter Ill. Further, output data B of an inverter 15-N is inputted into another input end of the NOR circuit 31 and another input end of the NOR circuit 32 through an inverter I12.

In addition, an output signal PGOK (="1") of the NOR circuit 31 is outputted only when writing or erasure of data has been completed. An output signal PNO (="1") of the NOR circuit 32 is outputted only when writing or erasure of data is incomplete.

Figure 18:
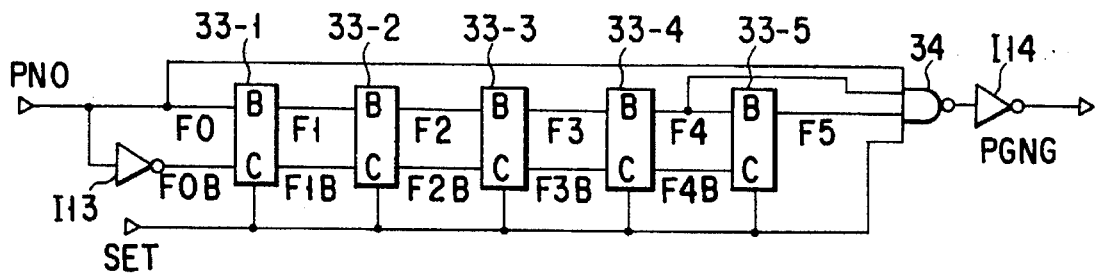
FIG. 18 is a circuit diagram showing a part of components of a re-write (or re-erase) signal generator circuit of the circuit shown in FIG. 12.
Figure 19:
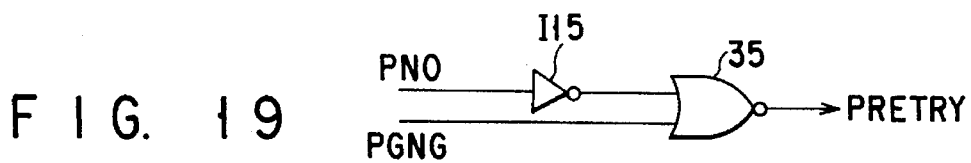
FIG. 19 is a circuit diagram showing a part of components of a re-write (or re-erase) signal generator circuit of the circuit shown in FIG. 12.

A re-write (or re-erase) signal generator circuit 30 is constituted by, for example, a counter as shown in FIG. 18 and a re-write (or re-erase) signal generator portion as shown in FIG. 19.

The structure of the counter will be explained with reference to FIG. 18.

Specifically, a write (or erase) incomplete signal PNO and a signal /PNO obtained by inverting the signal PNO through an inverter I13 are respectively inputted as signals F0 and F0B into a binary counter 33-1. In the same way, output signals Fk and FkB of a binary counter 33-k (k=1 to 4) are inputted into a binary counter 33-(k+1). Further, an output signal F5 of a binary counter 33-5 is inputted into a NAND circuit 34.

A set signal SET is inputted into each of binary 10 counters 33-1 to 33-5 and the NAND circuit 34. The NAND circuit 34 is further inputted with a write (or erase) incomplete signal PNO and an output signal F4 of a binary counter 33-4. An output end of the binary circuit 34 is connected to an inverter I14. A signal PGNG (="1") indicating a defective product is outputted from the inverter I14.

Figure 20:
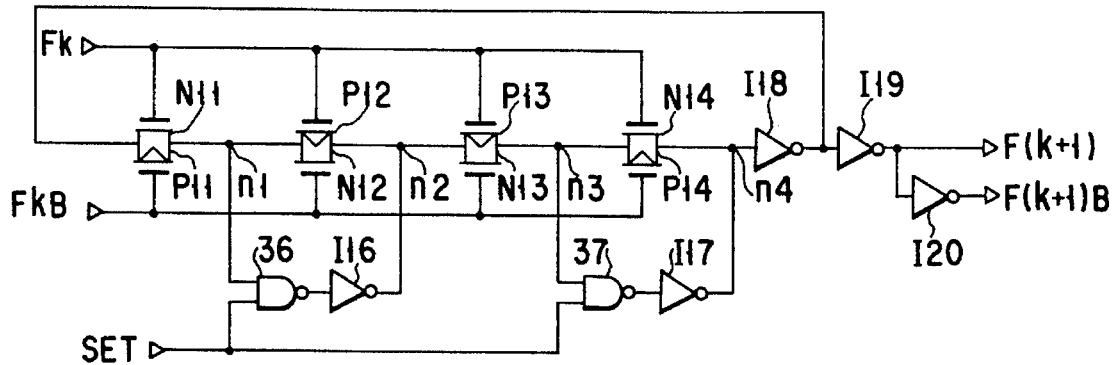
FIG. 20 is a circuit diagram showing a binary circuit shown in FIG. 18.

Each binary circuit has a structure as shown in FIG. 20, for example.

A signal Fk (k=0 to 4) is inputted into gates of N-channel MOS transistors N11 and N14 as well as P-channel MOS transistors P12 and P13. A signal FkB (k=0 to 4) is inputted into gates of N-channel MOS transistors N12 and N13 as well as P-channel MOS transistors P11 and P14. The transistors N11 and P11 are connected in parallel with each other. The transistors N13 and P13 are connected in parallel with each other, too. The transistors N14 and P14 are connected in parallel with each other as well.

The transistors N11 and P11, N12 and P12, N13 and P13, as well as N14 and P14 are connected in series with each other, thereby forming a serial circuit which has two ends connected with each other through an inverter I18.

An input end of a NAND circuit 36 is inputted with a set signal SET, while the other input end of the circuit 36 is inputted with a potential of a node n1. An output signal of the NAND circuit 36 is applied to a node n2 through an inverter I16. An input end of a NAND circuit 37 is inputted with a set signal SET, while the other end of the circuit 37 is inputted with a potential of a node n3. An output signal of the NAND circuit 37 is applied to a node n4 through an inverter I17.

An output signal of an inverter I18 is converted into a signal F(k+1) through an inverter I19, and then converted into a signal F(k+1)B through inverters I19 and I20. The signal F(k+1)B is then inputted into a binary counter or an NAND circuit 34 in the next stage.

The counter as stated above is used to limit the number of times for which verification is carried out. Therefore, an output signal PGNG of the counter is normally "0". However, when verification is repeated for a predetermined number of times (e.g., for twenty five times in this embodiment), all inputs to the NAND circuit 34 becomes "1" and the signal PGNG becomes "1".

The structure of a re-write (or re-erase) signal generator portion will be explained with reference to FIG. 19.

A write (or erase) incomplete signal PNO is inputted into an input end of an NOR circuit 35 through an inverter I15. An output signal PGNG of the counter stated above is directly inputted into the other input end of the NOR circuit 35.

The output signal PGNG of the counter is normally "0", while a re-write (or re-erase) signal PRETRY (="1") is outputted when a write (or erase) incomplete signal PNO (="1") is outputted.

Specifically, a re-write (or re-erase) signal generator circuit 30 receives a write (or erase) incomplete signal PNO and sends a re-write (or re-erase) signal PRETRY to a write (or erase) circuit 17. When verification is repeated for a predetermined number of times (e.g., for twenty five times), the re-write (or re-erase) signal generator circuit 30 generates a signal PGNG (="1") indicating that a product is defective without sending a re-write (or re-erase) signal PRETRY (="1") to the re-write (or re-erase) circuit 17.

The re-write (or re-erase) circuit 17 receives the re-write (or re-erase) signal PRETRY and carries out re-writing or re-erasure of data with respect to predetermined main cells MC in the memory cell 11.

Next, operation of the above-mentioned semiconductor memory circuit will be explained.

[A] Writing operation will be as follows:

Address data and input data are inputted into the memory circuit, and a circuit 17 writes the input data into memory cells designated by the address data. After a recovery time in which a high voltage to be applied to the memory cells is discharged, the circuit is brought into a verify mode for verifying threshold values of memory cells.

a. Where input data is "0":

It is supposed that although electrons have been injected into a flow gate of a main cell, the threshold value of the main cell is still low so that input data has not yet been sufficiently written. In this case, since a cell current flows through the main cell, the output data of a sensing amplifier is "1".

A comparator compares the input data "0" with output data "1" of a sensing amplifier. Since both of these data are not equal to each other, output data A-k (k=1, 2, ... N) of the comparator is "1".

Therefore, a control signal CTL2 becomes "1", and after a predetermined time period, a control signal CTL3 becomes "1". Output data A'-k of a latch circuit then becomes "1". Further, output data B of an inverter 15-N becomes "1".

Figure 24:
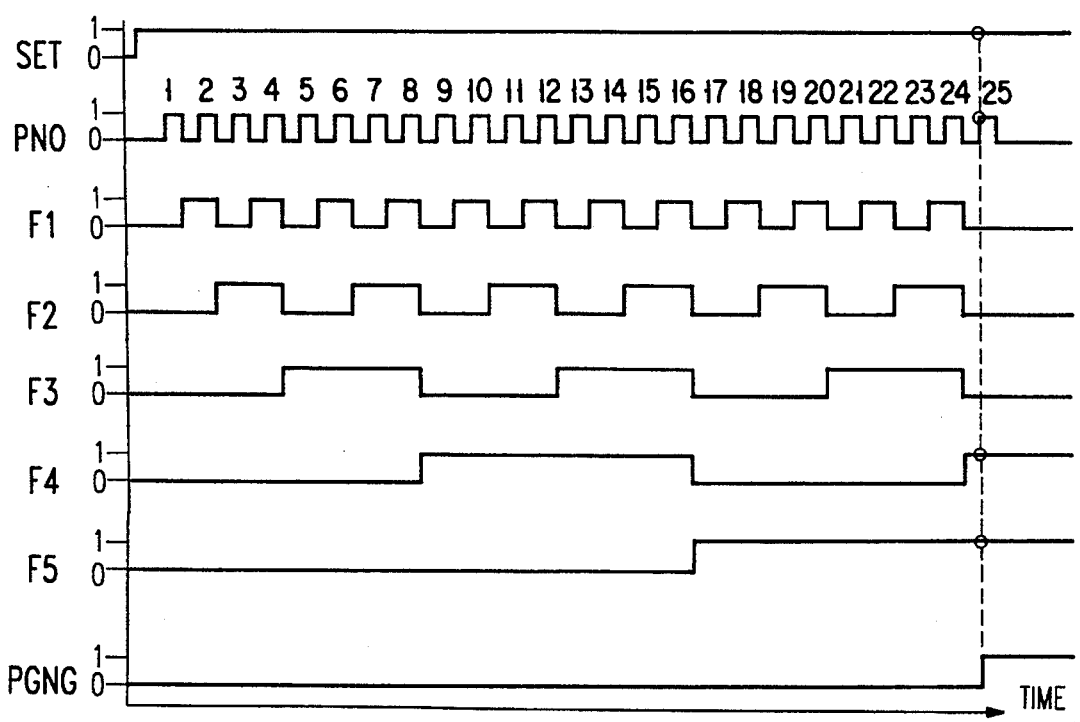
FIG. 24 is a timing chart showing operation of the circuit shown in FIG. 12.

A determination circuit 16 determines whether writing has been completed or is incomplete during an operation determination period, i.e., when a control signal CTL4 is "1". In this case, both of the control signal CTL4 and the output data B are "1", the determination circuit 16 outputs a write incomplete signal PNO (="1") as shown in FIG. 24.

In addition, a re-write signal generator circuit 30 receives the write incomplete signal PNO and outputs a re-write signal PRETRY (="1"). Therefore, a write circuit 17 receives a re-write signal PRETRY and writes the input data again into the main cell.

The re-write signal generator circuit 30 has a counter. This counter outputs a product defective signal PGNG (="1") when pulse of write incomplete signals PNO (="1") are counted for a predetermined number of times (e.g., twenty five times in this embodiment).

In addition, since the product defective signal PGNG is "1", the re-write signal PRETRY is always "0". Therefore, the write circuit 17 does not write the input data into the main cell.

Next, it is supposed that the threshold value of the main cell is substantially equal to the threshold value of a reference cell. In this case, the output of the sensing amplifier is rendered unstable, and alternately outputs data "1" and data "0". As a result, the output data A-k (k=1, 2, ... N) oscillates as shown in FIG. 22.

Therefore, the control signal CTL2 becomes "1", and after a predetermined time period therefrom, the control signal CTL3 becomes "1". The output data A'-k of the latch circuit then becomes "1" at the time when the output of a comparator becomes "1". The latch circuit keeps outputting output data "1" while the control signal CTL3 is "1".

Output data B of the inverter 15-N becomes "1", and the determination circuit 16 determines that data writing is incomplete (NG) during an operation determination period, and then outputs a write incomplete signal PNO (="1").

The re-write signal generator circuit 30 receives the write incomplete signal PNO, and outputs a re-write signal PRETRY (="1"). Therefore, the write circuit 17 receives the re-write signal PRETRY and writes the input data again into the main cell.

Next, it is supposed that electrons have been sufficiently injected into a floating gate, and the threshold value of a main cell is greater than the threshold value of a reference cell. In this case, since a cell current does not flow through a sensing amplifier, the sensing amplifier outputs data "0".

The comparator outputs "0" as output data A-k (k=1, 2, ... N), since the input data "0" is equal to output data "0" of the sensing amplifier.

Therefore, the control signal CTL2 becomes "1", and after a predetermined time period therefrom, the control signal CTL3 becomes "1". The output data A'-k of the latch circuit then becomes "0". Since the output data A-k of the comparator is always "0", the latch circuit keeps outputting output data "0" as the output data A'-k.

In addition, output data B of the inverter 15-N becomes "0" on condition that output data of all the latch circuits are "0", and the determination circuit 16 determines that data writing has been completed (OK) during an operation determination period.

Therefore, the determination circuit 16 determines that data writing has been completed (OK) during the operation determination period, and outputs a write complete signal PGOK (="1"). Since the determination circuit 16 outputs "0" as a write incomplete signal PNO, a re-write signal PRETRY also becomes "0" and re-writing of the input data is not carried out.

Note that a control signal CTL3 is thus changed to "1" after a predetermined time period D has passed since the circuit was brought into a verify mode by changing a control signal CTL2 to "1", in order to prevent output noise N of a sensing amplifier from influencing determination results. More specifically, since a condition that the output A-k of a comparator must always be "0" during a period in which the control signal CTL3 is "1" should be satisfied to determine that writing has been completed, the time period D is provided so that the noise N might not disturb the condition. (See FIG. 23.)

b. Where input data is "1":

Electrons are not injected into main cells, the threshold value of a main cell is maintained to be lower than the threshold value of a reference cell. Therefore, a cell current flows through a main cell, and the sensing amplifier outputs data "1".

Figure 23:
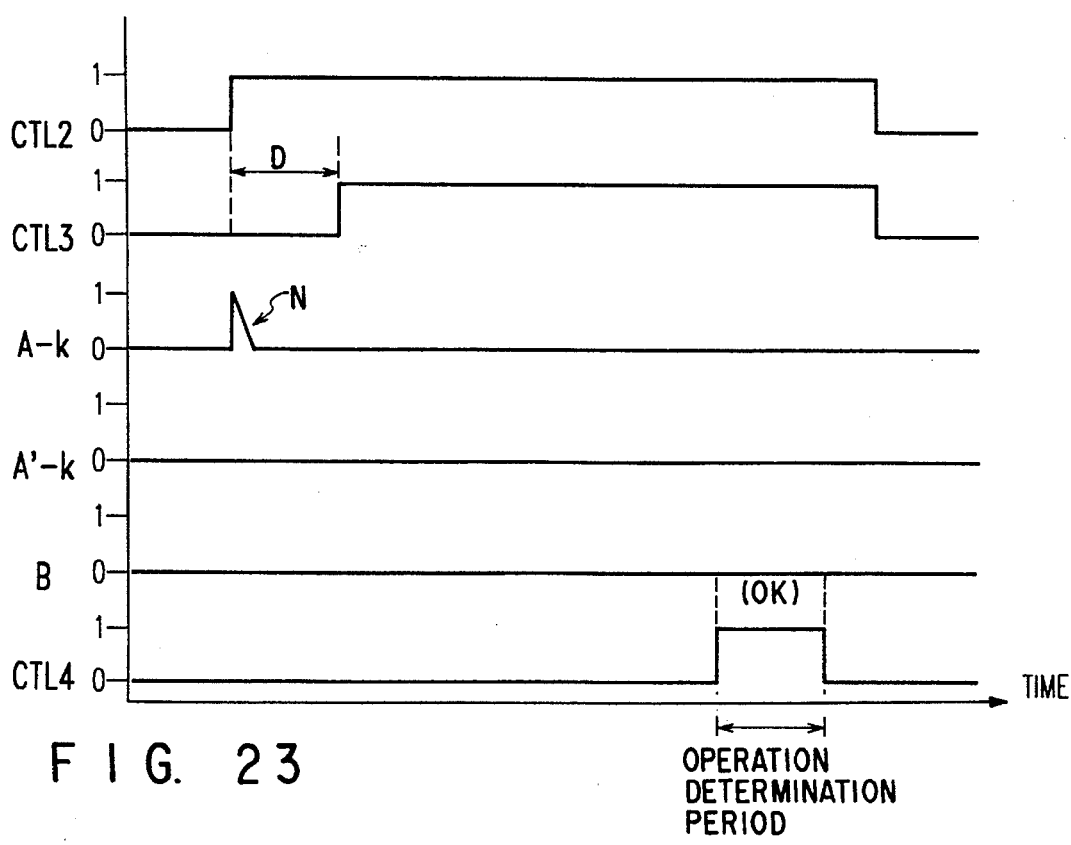
FIG. 23 is a timing chart showing operation of the circuit shown in FIG. 12.

A comparator outputs "0" (indicating completion of writing) as output data A-k (k=1, 2, ... N) as shown in FIG. 23, since the input data "1" is equal to the output data "1" of a sensing amplifier.

Therefore, the control signal CTL2 becomes "1", and after a predetermined time period therefrom, the control signal CTL3 becomes "1". Output data A'-k of a latch circuit then becomes "0". The latch circuit keeps outputting output data "0" since the output data of the comparator is always "0".

In addition, output data B of the inverter 15-N becomes "0" on condition that output data of all the latch circuits are "0", and the determination circuit 16 determines that data writing has been completed (OK) during an operation determination period. Then the determination circuit 16 outputs a write complete signal PGOK (="1").

[B] Erasure operation will be as follows:

At first, electrons are drawn out of floating gates of all memory cells. After a recovery time period for discharging a high voltage applied to the memory cells, the circuit is brought into a verify mode in which threshold values of memory cells are verified.

It is firstly supposed that electrons are not sufficiently drawn out from a floating gate of a memory cell and the threshold value of the main cell is still high so that erasure of input data is not yet sufficiently completed. In this case, since a cell current does not flow through the main cell, a sensing amplifier outputs data "0".

A comparator compares erasure data "1" with output data "0" of the sensing amplifier. Since both of these data are not equal to each other, output data A-k (k=1, 2, ... N) of the comparator is "1" as shown in FIG. 21.

Therefore, a control signal CTL2 becomes "1", and after a predetermined time therefrom, a control signal CTL3 becomes "1". Output data A'-k of a latch circuit then becomes "1". Further, output data B of an inverter 15-N becomes "1", so that a determination circuit 16 determines that erasure is not completed (NG) during an operation determination period.

Further, since a control signal CTL4 and the output data B are both "1", the determination circuit 16 outputs an erase incomplete signal PNO (="1") as shown in FIG. 24.

In addition, a re-erase signal generator circuit 30 receives the write incomplete signal PNO and outputs a re-erase signal PRETRY (="1"). Therefore, a erase circuit 17 receives a re-erase signal PRETRY and erases the data in the main cell again.

The re-erase signal generator circuit 30 has a counter. This counter outputs a product defective signal PGNG (="1") when pulses of erase incomplete signals PNO (="1") are counted for a predetermined number of times (e.g., twenty five times in this embodiment).

In addition, since the product defective signal PGNG is "1", the re-erase signal PRETRY is always "0". Therefore, the erase circuit 17 does not erase the input data into the main cell.

Next, it is supposed that the threshold value of the main cell is substantially equal to the threshold value of a reference cell. In this case, the output of the sensing amplifier is rendered unstable, and alternately outputs data "1" and data "0". As a result, the output data A-k (k=1, 2, ... N) of the comparator oscillates as shown in FIG. 22.

Therefore, the control signal CTL2 becomes "1", and after a predetermined time therefrom, the control signal CTL3 becomes "1". Then, the output data A'-k of the latch circuit becomes "1" at the time when the output of a comparator becomes "1". The latch circuit keeps outputting output data "1" while the control signal CTL3 is "1".

Output data B of the inverter 15-N becomes "1", and the determination circuit 16 determines that data erasure is incomplete (NG) during an operation determination period, and then outputs an erase incomplete signal PNO (="1").

The re-erase signal generator circuit 30 receives the erase incomplete signal PNO, and outputs a re-write signal PRE- TRY (="1"). Therefore, the erase circuit 17 receives the re-erase signal PRETRY and erases the data in the main cell again.

Next, it is supposed that electrons have been sufficiently drawn out of a floating gate, so that the threshold value of a main cell is smaller than the threshold value of a reference cell. In this case, since a cell current flows through a sensing amplifier, the sensing amplifier outputs data "1".

The comparator therefore outputs "0" as output data A-k (k=1, 2, ... N), since the erase data "1" is equal to output data "1" of the sensing amplifier, as shown in FIG. 23.

Therefore, the control signal CTL2 becomes "1", and after a predetermined time therefrom, the control signal CTL3 becomes "1". Then, the output data A'-k of the latch circuit becomes "0". Since the output data A-k of the comparator is always "0", the latch circuit keeps outputting output data "0" as the output data A'-k.

In addition, output data B of the inverter 15-N becomes "0" on condition that output data of all the latch circuits are "0". The determination circuit 16 determines that data erasure has been completed (OK) during an operation determination period.

Therefore, the determination circuit 16 determines that data erasure has been completed (OK) during the operation determination period, and outputs an erase complete signal PGOK (="1"). Since the determination circuit 16 outputs "0" as an erase incomplete signal PNO, an re-erase signal PRETRY also becomes "0" and re-erasure of the input data is not carried out.

FIG. 25 shows a semiconductor memory circuit according to a second embodiment of the present invention.

The structure of this memory circuit will be explained below.

Main cells 11 are connected with sensing amplifiers 12-1 to 12-N. Each sensing amplifier changes its output, depending on the relationship between the threshold value of a main cell and the threshold value of a reference cell. Specifically, when the threshold value of a main cell is greater than the threshold value of a reference cell (i.e., when data "0" is stored), data "0" is outputted. When the threshold value of a main cell is smaller than the threshold value of a reference cell (i.e., when data "1" is stored), data "1" is outputted. For example, the circuit shown in FIG. 3 may be used for each of the sensing amplifiers.

The sensing amplifiers 12-1 to 12-N are connected with comparators 13-1 to 13-N. The comparators 13-1 to 3-N compare input data (i.e., write data or erase data) with output data from the sensing amplifiers. Then, each comparator generates an output (data "0") indicating completion of writing or erasure when both of the input data and output data are equal to each other. When both of the data are not equal to each other, the comparator generates an output (data "1") indicating incomplete writing or erasure. For example, the circuit shown in FIG. 4 may be used for each comparator.

Output data of a comparator 13-1 is inputted into an input end of a NOR circuit 14-1. Data "0" is inputted into another input end of the NOR circuit 14-1. Output data of the NOR circuit 14-1 is inputted into an inverter 15-1.

Output data of a comparator 13-2 is inputted into an input end of a NOR circuit 14-2. Output data of the inverter 15-1 is inputted into another input end of the NOR circuit 14-2. Output data of the NOR circuit 14-2 is inputted into an inverter 15-2.

In the same way, output of a comparator 13-N is inputted into an end of a NOR circuit 14-N. Output data of an inverter 15-(N-1) is inputted into another end of the NOR circuit 14-N. Output data of the NOR circuit 14-N is inputted into an inverter 15-N.

Then, output data B of the inverter 15-N is inputted into a latch circuit 20. Each latch circuit is inputted with a control signal CTL3. The control signal CTL3 is obtained by making a control signal CTL2 from an external device pass through a delay circuit 19.

As a delay circuit, for example, a circuit having a structure as shown in FIG. 13 is used like in the semiconductor memory circuit according to the above-mentioned first embodiment. Therefore, the delay circuit delays a change of the control signal CRL3 from "0" to "1" by a predetermined period, only when the control signal CTL2 changes from "0" to "1" (at a starting point of an operation determination period).

As a latch circuit, for example, a circuit having a structure as shown in FIG. 14 is used like in the semiconductor memory circuit according to the above-mentioned first embodiment. Therefore, the latch circuit, as shown in FIGS. 15 and 16, if output data A-k of a comparator becomes "1" (indicating incomplete writing or erasure) during a period (i.e., an operation determination period) in which the control signal CTL3 is "1", the latch circuit keeps outputting data "1" as output data A'-k from the time point when the output data A-k becomes "1".

Output data B of a latch circuit 20 is inputted into a determination circuit 16, and the determination circuit determines whether or not desired data has been written into N pieces of main cells. If the determination circuit 16 determines that desired data has not been written in any one or more of the N pieces of main cells, the circuit 16 sends a write (or erase) incomplete signal PNO to a re-write (or re-erase) signal generator circuit 30.

The determination circuit 16 has a structure as shown in FIG. 17, for example. A re-write (or re-erase) signal generator circuit 30 is constituted by, for example, a counter as shown in FIG. 18 and a re-write (or re-erase) signal generator portion as shown in FIG. 19.

The re-write (or re-erase) signal generator circuit 30 receives a write (or erase) incomplete signal PNO and sends a re-write (or re-erase) signal PRETRY to a write (or erase) circuit 17.

When verification is repeated for a predetermined number of times (e.g., for twenty five times), the re-write (or re-erase) signal generator circuit 30 generates a signal PGNG (="1") indicating that a product is defective without sending a re-write (or re-erase) signal PRETRY (="1") to the re-write (or re-erase) circuit 17.

The re-write (or re-erase) circuit 17 receives the re-write (or re-erase) signal PRETRY and carries out re-writing or re-erasure of data with respect to predetermined main cells MC in the memory cell 11.

Next, operation of the above-mentioned semiconductor memory circuit will be explained.

[A] Writing operation will be as follows:

Address data and input data are inputted into the memory circuit, and the input data is inputted into memory cells designated by the address data. After a recovery time for discharging a high voltage to be applied to the memory cells, the circuit is brought into a verify mode for verifying threshold values of memory cells.

a. Where input data is "0":

It is supposed that although electrons have been injected into a flow gate of a main cell, the threshold value of the main cell is still low so that input data has not yet been sufficiently written. In this case, since a cell current flows through the main cell, the output data of a sensing amplifier is "1".

A comparator compares the input data "0" with output data "1" of a sensing amplifier. Since both of these data are not equal to each other, output data A-k (k=1, 2, ... N) of the comparator is "1", and at the same time, output data B of an inverter 15-N becomes "1".

Therefore, a control signal CTL2 becomes "1", and after a predetermined time period, a control signal CTL3 becomes "1". Output data A'-k of a latch circuit then becomes "1". As a result, a determination circuit 16 determines that writing is incomplete (NG) during an operation determination period, and outputs a write incomplete signal PNO (="1").

In addition, a re-write signal generator circuit 30 receives the write incomplete signal PNO and outputs a re-write signal PRETRY (="1"). Therefore, a write circuit 17 receives a re-write signal PRETRY and writes the input data again into the main cell.

The re-write signal generator circuit 30 has a counter. This counter outputs a product defective signal PGNG (="1") when pulses of write incomplete signals PNO (="1") are counted for a predetermined number of times (e.g., twenty five times in this embodiment).

In addition, since the product defective signal PGNG is "1", the re-write signal PRETRY is always "0". Therefore, the write circuit 17 does not write the input data into the main cell.

Next, it is supposed that the threshold value of the main cell is substantially equal to the threshold value of a reference cell. In this case, the output of the sensing amplifier is rendered unstable, and alternately outputs data "1" and data "0".

As a result, the output data A-k (k=1, 2, ... N) oscillates as shown in FIG. 27, thereby making the output data B of the inverter 15-N oscillate.

Therefore, the control signal CTL2 becomes "1", and after a predetermined time period therefrom, the control signal CTL3 becomes "1". The output data B' of the latch circuit becomes "1" at the time when the output data B of the inverter 15-N becomes "1". The latch circuit keeps outputting output data "1" while the control signal CTL3 is "1".

The determination circuit 16 determines that data writing is incomplete (NG) during an operation determination period, and then outputs a write incomplete signal PNO (="1").

The re-write signal generator circuit 30 receives the write incomplete signal PNO, and outputs a re-write signal PRETRY (="1"). Therefore, the write circuit 17 receives the re-write signal PRETRY and writes the input data again into the main cell.

Next, it is supposed that electrons have been sufficiently injected into a floating gate, and the threshold value of a main cell is greater than the threshold value of a reference cell. In this case, since a cell current does not flow through a sensing amplifier, the sensing amplifier outputs data "0".

The comparator outputs "0" as output data A-k (k=1, 2, ... N), since the input data "0" is equal to output data "0" of the sensing amplifier. In addition, output data B of the inverter 15-N becomes "0" on condition that output data of all the latch circuits are "0".

Therefore, the control signal CTL2 becomes "1", and after a predetermined time period therefrom, the control signal CTL3 becomes "1". The output data B' of the latch circuit then becomes "0". Since the output data B of the comparator is always "0", the latch circuit keeps outputting output data "0" as the output data B'.

The determination circuit 16 therefore determines that data writing has been completed (OK) during an operation determination period, and outputs a write complete signal PGOK (="1"). Since the determination circuit 16 outputs "0" as a write incomplete signal PNO, a re-write signal PRETRY also becomes "0" and re-writing of the input data is not carried out.

Note that a control signal CTL3 is thus changed to "1" after a predetermined time period D has passed since the circuit was brought into a verify mode by changing a control signal CTL2 to "1", in order to prevent output noise N of a sensing amplifier from influencing determination results. More specifically, since a condition that the output B of a comparator must always be "0" during a period in which the control signal CTL3 is "1" should be satisfied to determine that writing has been completed, the time period D is provided so that the noise N might not disturb the condition. (See FIG. 28.)

b. Where input data is "1":

Electrons are not injected into main cells, the threshold value of a main cell is maintained to be lower than the threshold value of a reference cell. Therefore, a cell current flows through a main cell, and the sensing amplifier outputs data "1".

A comparator outputs "0" (indicating completion of writing) as output data A-k (k=1, 2, ... N) as shown in FIG. 28, since the input data "1" is equal to the output data "1" of a sensing amplifier. In addition, output data B of the inverter 15-N becomes "0" on condition that output data of all the latch circuits are "0".

The control signal CTL2 becomes "1", and after a predetermined time period therefrom, the control signal CTL3 becomes "1". Output data B' of a latch circuit then becomes "0". The latch circuit keeps outputting output data "0" since the output data of the comparator is always "0".

Therefore, the determination circuit 16 determines that data writing has been completed (OK) during an operation determination period, and outputs a write complete signal PGOK (="1"). Since the determination circuit 16 outputs "0" as a write incomplete signal PNO, the re-write signal PRETRY becomes "0" and re-writing of the input data is not carried out again.

[B] Erasure operation will be as follows:

At first, electrons are drawn out of floating gates of all memory cells. After a recovery time period for discharging a high voltage applied to the memory cells, the circuit is brought into a verify mode in which threshold values of memory cells are verified.

It is firstly supposed that electrons are not sufficiently drawn out from a floating gate of a memory cell and the threshold value of the main cell is still high so that erasure of input data is not yet sufficiently completed. In this case, since a cell current does not flow through the main cell, a sensing amplifier outputs data "0".

A comparator compares erasure data "1" with output data "0" of the sensing amplifier. Since both of these data are not equal to each other, output data A-k (k=1, 2, ... N) of the comparator is "1" as shown in FIG. 26.

Therefore, a control signal CTL2 becomes "1", and after a predetermined time therefrom, a control signal CTL3 becomes "1". Output data B' of a latch circuit then becomes "1". The determination circuit 16 determines that erasure is not completed (NG) during an operation determination period, and outputs an erase incomplete signal PNO (="1").

In addition, a re-erase signal generator circuit 30 receives the write incomplete signal PNO and outputs a re-erase signal PRETRY (="1"). Therefore, an erase circuit 17 receives a re-erase signal PRETRY and erases the data in the main cell again.

Next, it is supposed that the threshold value of the main cell is substantially equal to the threshold value of a reference cell. In this case, the output of the sensing amplifier is rendered unstable, and alternately outputs data "1" and data "0". As a result, the output data A-k (k=1, 2, ... N) of the comparator oscillates as shown in FIG. 27, and accordingly, output data B of the inverter 15-N oscillates.

The control signal CTL2 becomes "1", and after a predetermined time therefrom, the control signal CTL3 becomes "1". Then, the output data B' of the latch circuit becomes "1" at the time when the output of a comparator becomes "1". The latch circuit keeps outputting output data "1" while the control signal CTL3 is "1".

The determination circuit 16 determines that data erasure is incomplete (NG) during an operation determination period, and then outputs an erase incomplete signal PNO (="1").

The re-erase signal generator circuit 30 receives the erase incomplete signal PNO, and outputs a re-write signal PRETRY (="1"). Therefore, the erase circuit 17 receives the re-erase signal PRETRY and erases the data in the main cell again.

Next, it is supposed that electrons have been sufficiently drawn out of a floating gate, so that the threshold value of a main cell is smaller than the threshold value of a reference cell. In this case, since a cell current flows through a sensing amplifier, the sensing amplifier outputs data "1".

The comparator therefore outputs "0" as output data A-k (k=1, 2, ... N), since the erase data "1" is equal to output data "1" of the sensing amplifier, as shown in FIG. 28.

The control signal CTL2 becomes "1", and after a predetermined time therefrom, the control signal CTL3 becomes "1". Then, the output data B' of the latch circuit becomes "0". Since the output data B of the comparator is always "0", the latch circuit keeps outputting output data "0" as the output data B'.

Therefore, the determination circuit 16 determines that data erasure has been completed (OK) during an operation determination period, and outputs an erase complete signal PGOK (="1"). Since the determination circuit 16 outputs "0" as an erase incomplete signal PNO, an re-erase signal PRETRY also becomes "0" and re-erasure of the input data is not carried out.

In the first and second embodiments as stated above, writing and erasure of data are simultaneously performed with respect to a plurality of memory cells (e.g., N pieces of memory cells in these embodiments). In addition, the determination circuit carries out re-writing and re-erasure, when data writing or erasure has been completed with respect to at least one memory cell.

It is therefore possible to arrange the determination circuit, the re-write (or re-erase) signal generation circuit, and the write (or erase) circuit such that re-writing (or re-erasure) is independently carried out for a main cell with respect to which writing (or erasure) has been determined as incomplete, while rewriting (or re-erasure) is not carried out for a main cell with respect to which writing (or erasure) has been determined as completed.

In this case, re-writing or re-erasure can be performed for every main cell, and the threshold value of each main cell can be stabilized after writing or erasure, without enlarging the range of a distribution of threshold values of main cells after writing or erasure.

As has been explained above, in the semiconductor memory circuit according to the present invention, the following advantages are obtained.

a. A comparator is connected with a determination circuit through a latch circuit. Within a period in which a control signal CTL3 is "1", the latch circuit keeps outputting data "1" from a time point when the output data of the comparator once becomes "1" (indicating inequality between the input data and read out data).

This means that the latch circuit always outputs data "1" (indicating incomplete writing or erasure) when writing or erasure of data is not yet sufficiently completed so that the output of a sensing amplifier oscillates and the output of a comparator also oscillates.

Therefore, when the latch circuit outputs data "0" (indicating completion of writing or erasure), the threshold value of the main cell has a sufficient difference from the threshold value of a reference cell so that writing or erasure can be sufficiently performed, without enlarging the range of distribution of threshold values of main cells after writing or erasure.

b. The determination circuit outputs a write incomplete signal PNO (="1") when an input signal is "1" (indicating incompletion of writing or erasure). The re-write (or re-erasure) signal generator circuit receives the write (or erase) incomplete signal PNO, and outputs a re-write (or re-erase) signal PRETRY (="1").

In addition, the rewrite (or re-erase)signal generator circuit outputs a product defective signal PGNG when write (or erase) incomplete signals PNO are counted for a predetermined number of times, and does not output a re-write (or re-erase) signal PRETRY.

Further, the determination circuit does not generate a write (or erase) incomplete signal PNO but outputs a write (or erase) complete signal PGOK (="1"), when the input signal is "0" (indicating completion of writing or erasure).

Writing or erasure therefore can be sufficiently performed in main cells, and verification can be performed such that those main cells with respect to which sufficient writing or erasure has been performed are verified as effective products, while those main cells with respect to which re-writing or re-erasure has been repeated for a predetermined number of times are verified as defective products.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory circuit having a verify mode, comprising:

first means for writing input data into a main cell;

a sensing amplifier for reading data in the main cell;

a comparator for comparing data read through the sensing amplifier with the input data, thereby determining whether or not the data read and the input data are equal to each other, for outputting equality data when the data are equal, and for outputting inequality data when the data are not equal;

a latch circuit, receiving a first control signal, for latching and outputting the inequality data when the comparator outputs the inequality data for at least one time within a first predetermined period decided by the first control signal, and for latching and outputting the equality data only when the comparator continuously outputs the equality data within the first predetermined period;

a determination circuit, receiving a second control signal, for determining whether writing of the input data has been completed with respect to the main cell on the basis of output data of the latch circuit in a second predetermined period decided by the second control signal; and second means for instructing the first means to write the input data again to the main cell when the determination circuit determines that writing of the input data is incomplete with respect to the main cell.

2. A circuit according to claim 1, wherein the sensing amplifier compares a threshold value of the main cell with a threshold value of a reference cell, and outputs a value of data to be read out, depending on a relationship in amounts between a cell current flowing through the main cell and a cell current flowing through the reference cell.

3. A circuit according to claim 1, wherein reading of data in the main cell is started by a third control signal, and the circuit further comprises a delay circuit for delaying the third control signal by a predetermined time period, to obtain the first control signal.

4. A circuit according to claim 1, further comprising:

N (where N is a natural number) sets of third means, each set consisting of the sensing amplifier, the comparator and the latch circuit; and fourth means for outputting inequality data when at least one of the N sets of third means outputs inequality data, and for outputting equality data only when all the third means output equality data, wherein output data of the fourth means is inputted into the determination circuit.

5. A circuit according to claim 1, further comprising:

N (where N is a natural number) sets of third means, each set consisting of the sensing amplifier and the comparator; and fourth means for outputting inequality data when at least one of the N sets of third means outputs inequality data, and for outputting equality data only when all the third means output equality data, wherein output data of the fourth means is inputted into the latch circuit.

6. A circuit according to claim 1, wherein the determination circuit outputs a write complete signal when the determination circuit determines that writing has been completed.

7. A circuit according to claim 1, wherein the second means outputs a signal indicating that the memory circuit is defective, when writing of the input data is repeated for a predetermined number of times, and thereafter prevents the first means from writing data again.

8. A semiconductor memory circuit having a verify mode, comprising:

first means for erasing input data stored in a main cell;

a sensing amplifier for reading data in the main cell;

a comparator for comparing data read through the sensing amplifier with data remaining when data is completely erased in the main cell, thereby determining whether or not the data are equal, for outputting equality data when the data are equal to each other, and for outputting inequality data when the data are not equal;

a latch circuit, receiving a first control signal, for latching and outputting the inequality data when the comparator outputs the inequality data for at least one time within a first predetermined period decided by the first control signal, and for latching and outputting the equality data only when the comparator continuously outputs the equality data in the first predetermined period;

a determination circuit, receiving an input of a second control signal, for determining whether erasure of the data in the main cell has been completed with respect to the main cell on the basis of output data of the latch circuit in a second predetermined period decided by the second control signal; and second means for instructing the first means to erase the data in the main cell again when the determination circuit determines that erasure of the data in the main cell is incomplete.

9. A circuit according to claim 8, wherein the sensing amplifier compares a threshold value of the main cell with a threshold value of a reference cell, and outputs a value of data to be read out, depending on a relationship in amounts between a cell current flowing through the main cell and a cell current flowing through the reference cell.

10. A circuit according to claim 8, wherein reading of data in the main cell is started by a third control signal, and the circuit further comprises a delay circuit for delaying the third control signal by a predetermined time period, to obtain the first controls signal.

11. A circuit according to claim 8, further comprising:

N (where N is a natural number) sets of third means, each set consisting of the sensing amplifier, the comparator and the latch circuit; and fourth means for outputting inequality data when at least one of the N sets of third means outputs inequality data, and for outputting equality data only when all the third means output equality data, wherein output data of the fourth means is inputted into the determination circuit.

12. A circuit according to claim 8, further comprising:

N (where N is a natural number) sets of third means, each set consisting of the sensing amplifier and the comparator; and fourth means for outputting inequality data when at least one of the N sets of third means outputs inequality data, and for outputting equality data only when all the third means output equality data, wherein output data of the fourth means is inputted into the latch circuit.

13. A circuit according to claim 8, wherein the determination circuit outputs an erase complete signal when the determination circuit determines that erasing has been completed.

14. A circuit according to claim 8, wherein the second means outputs a signal indicating that the memory circuit is defective, when erasure of the input data is repeated for a predetermined number of times, and thereafter prevents the first means from erasing data again.

* * * * *